(12) United States Patent
Chu et al.

(10) Patent No.: US 12,002,867 B2
(45) Date of Patent: Jun. 4, 2024

(54) CONTACT STRUCTURE FOR SEMICONDUCTOR DEVICE

(71) Applicant: TAIWAN SEMICONDUCTOR MANUFACTURING CO., LTD., Hsinchu (TW)

(72) Inventors: Chia-Hung Chu, Taipei (TW); Shuen-Shin Liang, Hsinchu County (TW); Hsu-Kai Chang, Hsinchu (TW); Tzu Pei Chen, Hsinchu (TW); Kan-Ju Lin, Kaohsiung (TW); Chien Chang, Hsinchu (TW); Hung-Yi Huang, Hsin-chu (TW); Sung-Li Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 151 days.

(21) Appl. No.: 17/459,494

(22) Filed: Aug. 27, 2021

(65) Prior Publication Data

US 2023/0068965 A1    Mar. 2, 2023

(51) Int. Cl.
*H01L 29/45* (2006.01)
*H01L 21/311* (2006.01)
(Continued)

(52) U.S. Cl.
CPC ........ *H01L 29/45* (2013.01); *H01L 21/31116* (2013.01); *H01L 21/823475* (2013.01);
(Continued)

(58) Field of Classification Search
CPC .............. H01L 29/45; H01L 21/31116; H01L 21/823475; H01L 23/53242; H01L 23/535; H01L 29/401; H01L 29/41791; H01L 27/088; H01L 29/66795; H01L 29/785; H01L 21/28556; H01L 21/76883; H01L 21/76895; H01L 21/76879; H01L 21/28518; H01L 21/76831; H01L 23/5226; H01L 23/53257; H01L 23/485; H01L 29/78; H01L 29/0847
See application file for complete search history.

(56) References Cited

U.S. PATENT DOCUMENTS 9,093,530 B2    7/2015   Huang et al.
9,171,929 B2   10/2015   Lee et al.
(Continued)

*Primary Examiner* — Farun Lu
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a gate structure over the substrate, a layer of dielectric material over the gate structure, a source/drain (S/D) contact layer formed through and adjacent to the gate structure, and a trench conductor layer over and in contact with the S/D contact layer. The S/D contact layer can include a layer of platinum-group metallic material and a silicide layer formed between the substrate and the layer of platinum-group metallic material. A top width of a top portion of the layer of platinum-group metallic material can be greater than or substantially equal to a bottom width of a bottom portion of the layer of platinum-group metallic material.

20 Claims, 18 Drawing Sheets

(51) Int. Cl.
    *H01L 21/8234*     (2006.01)
    *H01L 23/532*     (2006.01)
    *H01L 23/535*     (2006.01)
    *H01L 29/40*     (2006.01)
    *H01L 29/417*     (2006.01)

(52) U.S. Cl.
    CPC ...... *H01L 23/53242* (2013.01); *H01L 23/535* (2013.01); *H01L 29/401* (2013.01); *H01L 29/41791* (2013.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2018/0174904 A1* | 6/2018 | Hsieh ................ H01L 21/76831 |
| 2018/0269297 A1* | 9/2018 | Zhang ............... H01L 21/76889 |
| 2019/0305135 A1* | 10/2019 | Radosavljevic .. H01L 21/02609 |
| 2020/0161173 A1* | 5/2020 | Wang ................ H01L 21/31055 |

* cited by examiner

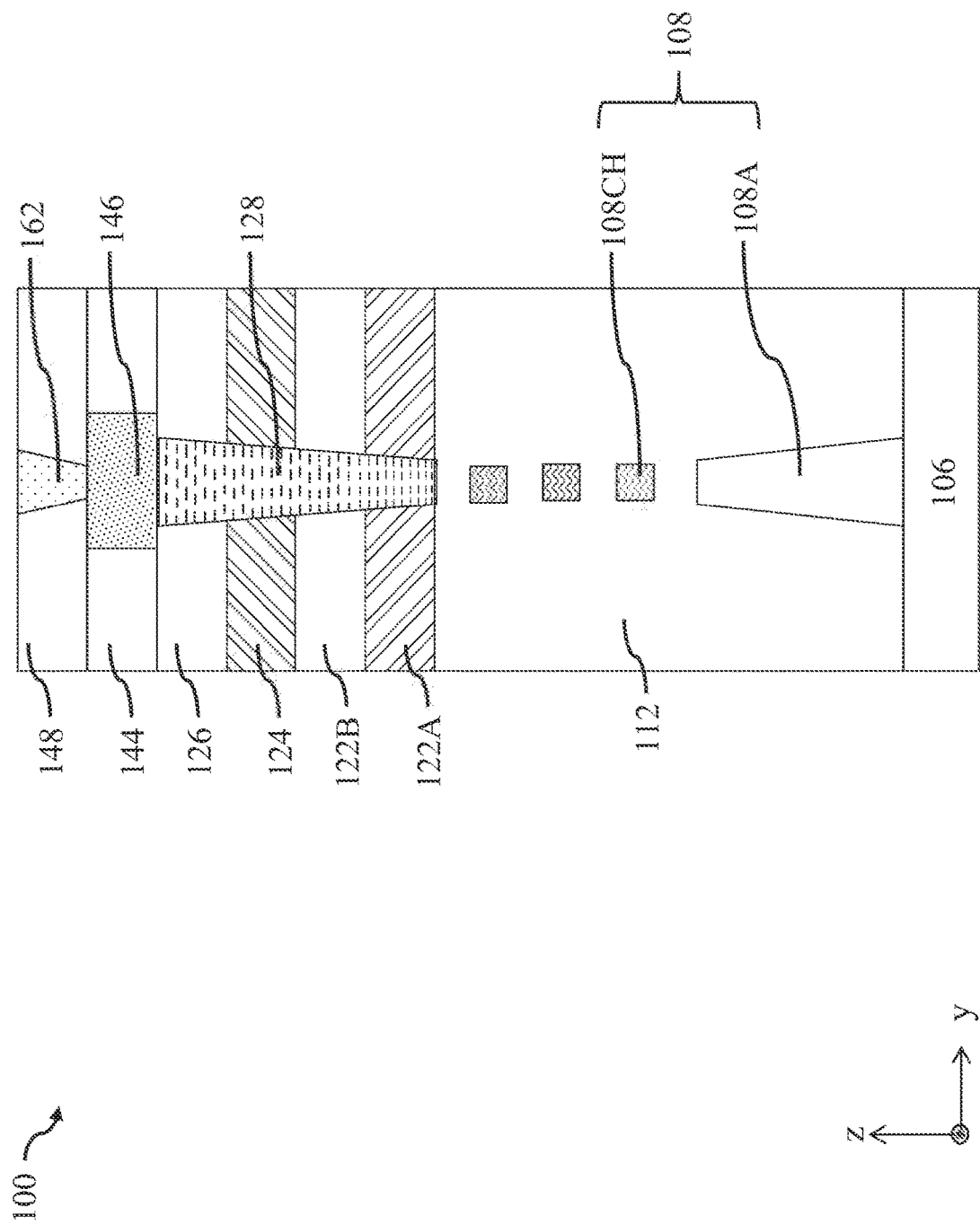

CONTACT STRUCTURE FOR SEMICONDUCTOR DEVICE

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices. Such scaling down has increased the complexity of semiconductor device manufacturing processes.

BRIEF DESCRIPTION OF THE DRAWINGS

Aspects of this disclosure are best understood from the following detailed description when read with the accompanying figures.

FIGS. 2A-2C and 3 illustrate cross-sectional views of a semiconductor device, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
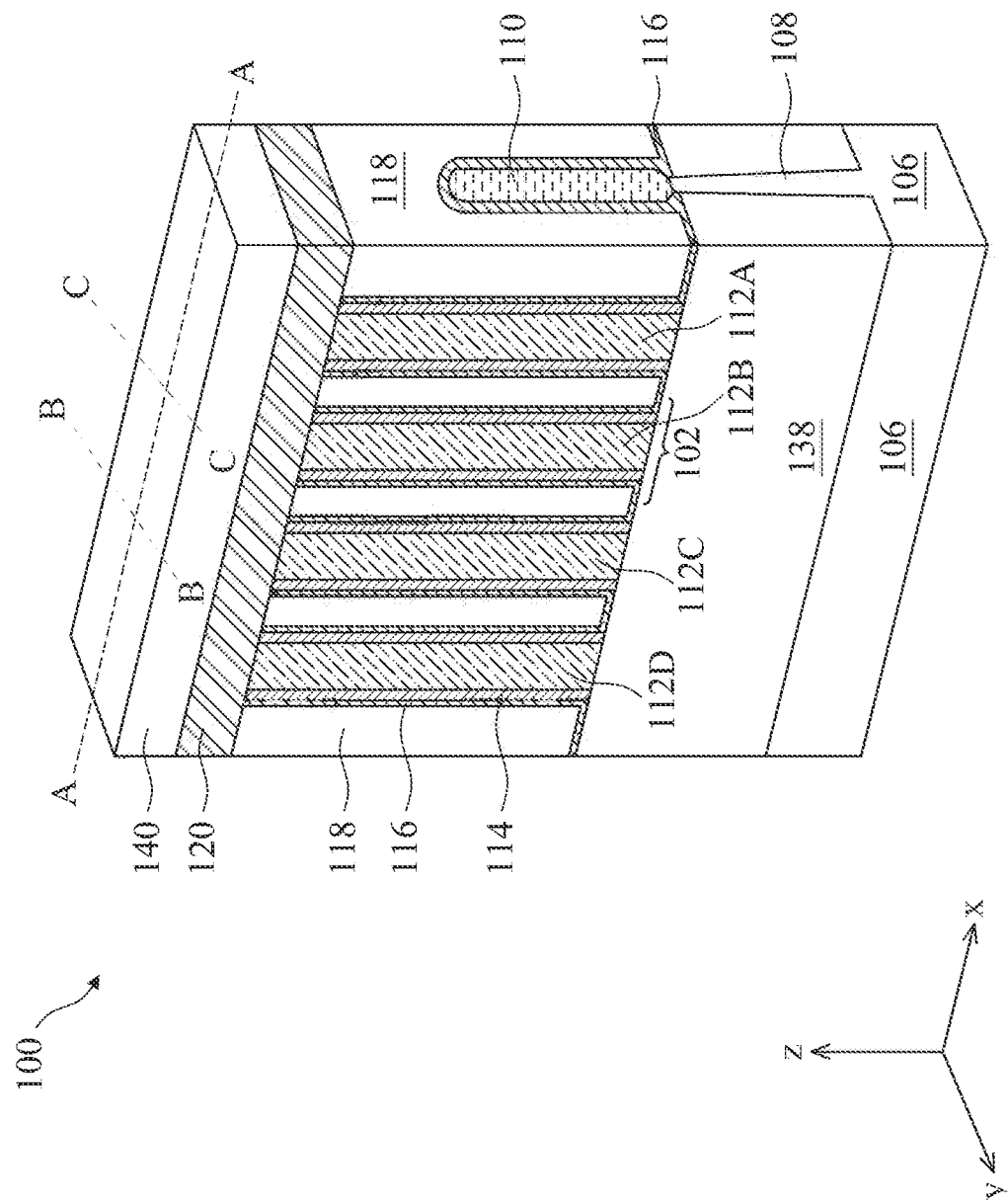
FIG. 1 illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (ICs) having higher device density, higher performance, and lower cost. In the course of the IC evolution, the transistor structure together with the contact structure (e.g., source/drain (S/D) contact structure) are scaled down to achieve ICs with higher transistor densities. With the scaling down of the contact structure, the contact structure's resistance can be increased. Therefore, cobalt has been adopted as the conductive material to provide a reduced resistivity for the contact structure. However, the cobalt contact structure requires a liner structure to promote adhesion and/or to act as a diffusion barrier to ensure the contact structure's structural integrity. This liner structure reduces effective contact area of the contact structure, thus increasing contact resistance and reducing IC performance. Further, cobalt tends to diffuse out from the contact structure towards vertically adjacent contact structures during the back-end-of-line (BEOL) process of forming the interconnect structure. Such cobalt diffusion forms voids in the contact structure, thus reducing IC yield and performance.

To address the aforementioned challenges, the present disclosure is directed to a fabrication method and a transistor structure with a contact structure. The transistor structure can include a gate structure and a source/drain (S/D) region adjacent to the gate structure. The contact structure can have a horizontal dimension less than about 30 nm, such as less than about 20 nm, to meet a technology node requirement (e.g., beyond a 14 nm technology node, such as 7 nm, 5 nm, and 3 nm nodes) of the contact structure. The contact structure can be cobalt-free to avoid the formation of voids in the contact structure. For example, the contact structure can be made of a platinum-group metallic material, such as ruthenium, because the platinum-group metallic material can have a lower diffusivity than that of cobalt to inhibit the void formation as described in the aforementioned challenges. Further, the reduced diffusivity of the platinum-group metallic material allows the contact structure to be barrierless or liner free because the platinum-group metallic material can have sufficient adhesion to the sidewall of the dielectric layer where the contact structure is formed in. By omitting the barrier liner from the contact structure, the contact structure can a reduced resistance. Therefore, a benefit of the present disclosure, among others, is to provide the contact structure with reliable structural integrity (e.g., avoid void formation) and a reduced resistance (e.g., increased effective contact area by omitting barrier or liner), thus enhancing the IC's yield and reliability.

Figure 2A:
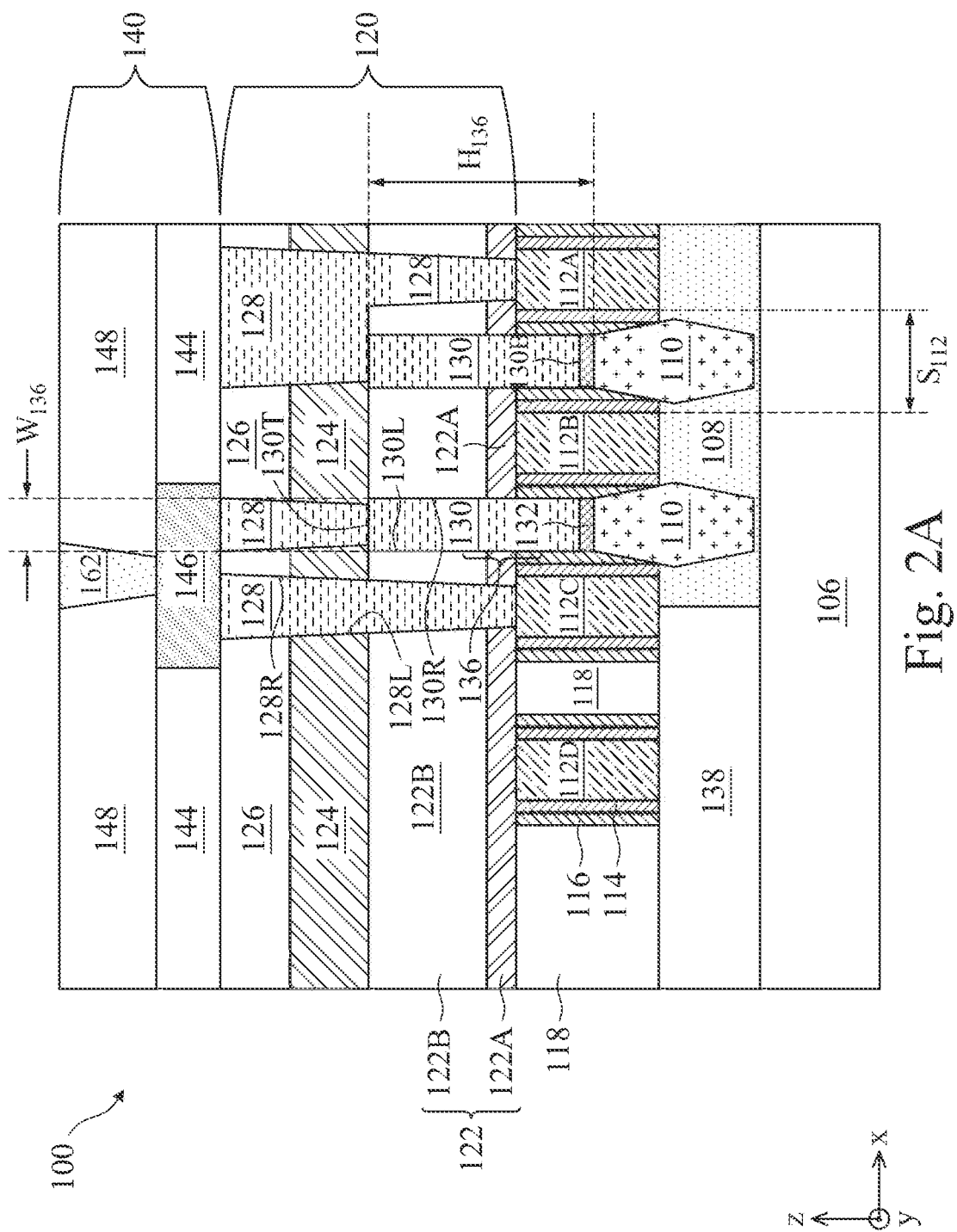
Figure 2C:
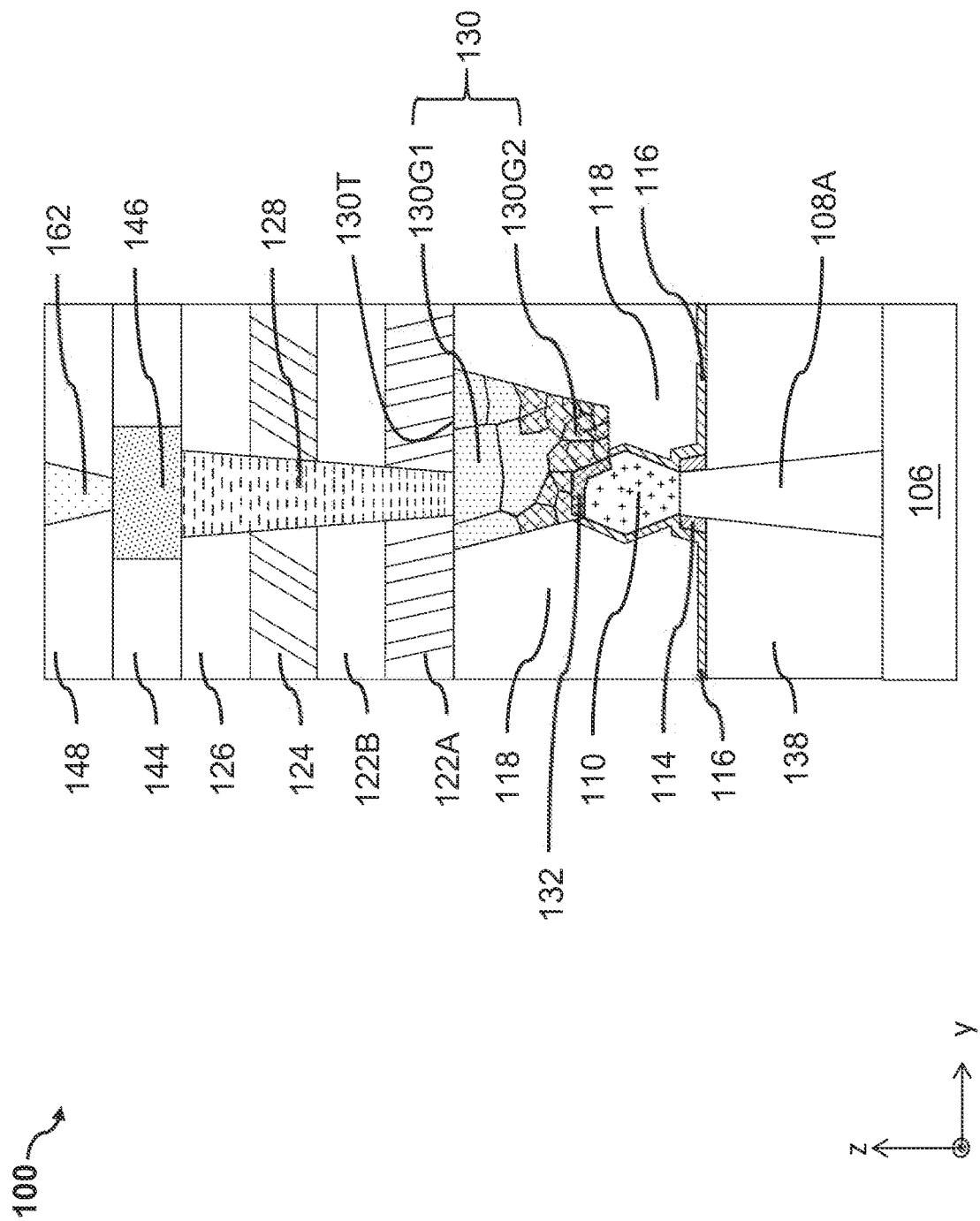
Figure 3:
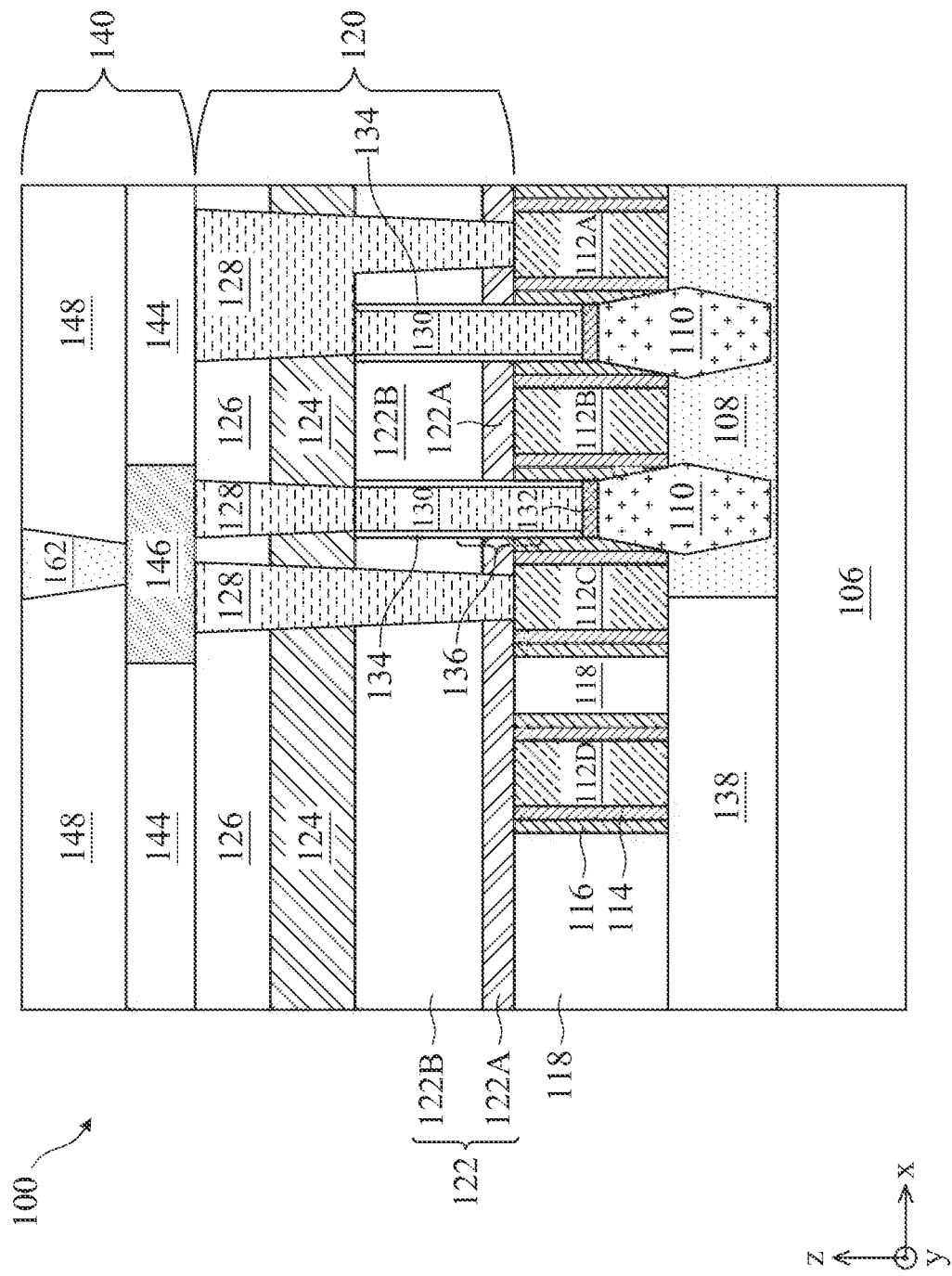

A semiconductor device 100 having multiple field effect transistors (FETs) 102, a contact structure 120 disposed over FETs 102, and an interconnect structure 140 disposed over contact structure 120 is described with reference to FIGS. 1, 2A-2C, and 3, according to some embodiments. FIG. 1 illustrates an isometric view of semiconductor device 100, according to some embodiments. FIGS. 2A and 3 illustrate cross-sectional views along line A-A of semiconductor device 100 of FIG. 1, according to some embodiments. FIG. 2B illustrates a cross-sectional view along line B-B of semiconductor device 100 of FIG. 1, according to some embodiments. FIG. 2C illustrates a cross-sectional view along line C-C of semiconductor device 100 of FIG. 1, according to some embodiments. The discussion of elements in FIGS. 1, 2A-2C, and 3 with the same annotations applies to each other, unless mentioned otherwise. Semiconductor device 100 can be included in a microprocessor, memory cell, or other integrated circuit. Though FETs 102 shown in FIGS. 1, 2A-2C, and 3 are gate-all-around (GAA) FET, each FET 102 can be a fin field effect transistor (finFET), according to some embodiments.

Referring to FIGS. 1 and 2A-2C, FET 102 can include a fin structure 108 extending along an x-direction, a gate structure 112 (e.g., gate structures 112A-112D) traversing through fin structure 108 along a y-direction, and a source/drain (S/D) region 110 formed over portions of fin structure 108. In some embodiments, FET 102 can include multiple fin structures 108 (not shown in FIGS. 1 and 2A-2C), where each of the multiple fin structures 108 can extend along an x-direction and traversed by a common gate structure 112. FET 102 can be formed on a substrate 106. Substrate 106 can be a semiconductor material, such as silicon (Si). In some embodiments, substrate 106 can include (i) an elementary semiconductor, such as Si and germanium (Ge); (ii) a compound semiconductor including silicon carbide (SiC), gallium arsenide (GaAs), gallium phosphide (GaP), indium phosphide (InP), indium arsenide (InAs), and indium antimonide (InSb); or (iii) a combination thereof. In some embodiments, substrate 106 can be doped with p-type dopants (e.g., boron (B), indium (In), aluminum (Al), or gallium (Ga)) or n-type dopants (e.g., phosphorus (P) or arsenic (As)).

Referring to FIG. 2B, fin structure 108 can be formed over substrate 106. Fin structure 108 can extend along an x-direction and traversed by one or more gate structures 112 (e.g., gate structures 112A-112D) along a y-direction. Fin structure 108 can include a buffer layer 108A disposed on substrate 106. Buffer layer 108A can be made of materials similar to substrate 106 to ensure channel regions of FETs 102 being crystalline defect-free. In some embodiments, buffer layer 108A can be made of a semiconductor material that has a lattice mismatch less than about 0.5% compared to substrate 106. In some embodiments, buffer layer 108A and substrate 106 can be made of an identical material, such as Si. Fin structure 108 can further include one or more channel layers 108CH disposed on buffer layer 108A. Each channel layer 108CH can be traversed and/or surrounded by gate structure 112 to be FET 102's channel region. Each channel layer 108CH can be made of Si or silicon germanium (SiGe). In some embodiments, channel layer 108CH can have a greater germanium atomic concentration than buffer layer 108A and substrate 106.

Referring to FIG. 2C, S/D region 110 can be formed over fin structure 108. S/D region 110 can include an epitaxially-grown semiconductor material. In some embodiments, the epitaxially-grown semiconductor material can be the same material as substrate 106. For example, the epitaxially-grown semiconductor material can have a lattice constant substantially close to (e.g., lattice mismatch within 5%) that of substrate 106. In some embodiments, the epitaxially-grown semiconductor material can include: (i) a semiconductor material, such as Ge and Si; (ii) a compound semiconductor material, such as GaAs and AlGaAs; or (iii) a semiconductor alloy, such as SiGe and GaAsP. S/D region 110 can be doped with p-type dopants or doped with n-type dopants. The p-type dopants can include B, In, Al, or Ga. The n-type dopants can include P or As.

Referring to FIGS. 2A-2C, gate structure 112 (e.g., gate structures 112A-112D) can be multi-layered structures that wraps around portions of fin structure 108. For example, as shown in FIG. 2B, gate structure 112 can wrap FET 102's channel layers 108CH to modulate a conductivity of FET 102's channel region. Gate structures 112 can be horizontally (e.g., in the x-direction) separated from each other by a separation $S_{112}$ (shown in FIG. 2A) from about 35 nm to about 75 nm. If separation $S_{112}$ is below the above-noted lower limit, S/D region 110 may not have sufficient volume to lower FET 102's parasitic resistance. If separation $S_{112}$ is beyond the above-noted upper limit, semiconductor device 100 may not meet an associated technology node's gate pitch requirement. In some embodiments, a group of gate structures 112 (e.g., gate structures 112A and 112B) can wrap around fin structures 108, and another group of gate structures (e.g., gate structure 112D) can be formed over and in contact with STI region 138 (discussed below) and separated from fin structure 108. In some embodiments, gate structure 112 (e.g., gate structure 112C) can wrap around fin structures 108 and formed over and in contact with STI region 138.

Gate structure 112 can include a gate dielectric layer (not shown in FIGS. 1 and 2A-2C), a gate electrode (not shown in FIGS. 1 and 2A-2C) disposed on the gate dielectric layer, and gate spacers 114 (shown in FIGS. 2A and 2C) disposed on sidewalls of the gate electrode. The gate dielectric layer can be wrapped around fin structure 108, hence electrically isolating fin structure 108 from the gate electrode. The gate dielectric layer can be disposed between the gate electrode and S/D regions 110 to prevent an electrical short there between.

The gate dielectric layer can include any suitable dielectric material, such as (i) a layer of silicon oxide, silicon nitride, and silicon oxynitride, (ii) a high-k dielectric material that has a dielectric constant greater than that of silicon dioxide (e.g., greater than about 3.9), such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (iii) a combination thereof, that separates the gate electrode from fin structure 108. In some embodiments, the gate dielectric layer can include a single layer or a stack of insulating material layers. The gate dielectric layer can have a thickness ranging from about 1 nm to about 5 nm. Other materials and thicknesses for the gate dielectric layers are within the spirit and scope of this disclosure.

The gate electrode can be a gate terminal of FET 102. The gate electrode can include metal stacks that wrap about fin structure 108. In some embodiments, the gate electrode can include a gate barrier layer (not shown in FIGS. 1 and 2A-2C), a gate work function layer (not shown in FIGS. 1 and 2A-2C), and a gate metal fill layer (not shown in FIGS. 1 and 2A-2C). The gate barrier layer can serve as a nucleation layer for subsequent formation of a gate work function layer. The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, or combinations thereof. Gate metal fill layer can include a single metal layer or a stack of metal layers. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Other materials for the gate barrier layer, the gate work function layer, and the gate metal fill layer are within the spirit and scope of this disclosure.

Gate spacer 114 (shown in FIG. 2C) can physically contact the gate dielectric layers. In some embodiments, as shown in FIG. 2C, gate spacer 114 can be formed over fin structure 108's side surfaces. Gate spacer 114 can include a low-k material with a dielectric constant less than about 3.9. For example, gate spacer 114 can include an insulating material, such as silicon oxide, silicon nitride, a low-k material, and a combination thereof. In some embodiments, gate spacer 114 can have a thickness ranging from about 2 nm to about 10 nm. Other materials and thicknesses for gate spacer 114 are within the spirit and scope of this disclosure.

Referring to FIGS. 1, 2A, and 2C, semiconductor device 100 can further include shallow trench isolation (STI) regions 138 that provide electrical isolation for fin structure 108. For example, STI regions 138 can electrically isolate fin structure 108 from another fin structure 108 (not shown in FIG. 1) formed in semiconductor device 100. Also, STI regions 138 can provide electrical isolation between FETs 102 and neighboring active and passive elements (not shown in FIG. 1) integrated with or deposited on substrate 106. STI regions 138 can include one or more layers of dielectric material, such as a nitride layer, an oxide layer disposed on the nitride layer, and an insulating layer disposed on the nitride layer. In some embodiments, an insulating layer can refer to a layer that functions as an electrical insulator (e.g., a dielectric layer). In some embodiments, the insulating layer can include silicon oxide, silicon nitride, silicon oxynitride, fluorine-doped silicate glass (FSG), a low-k dielectric material, or other suitable insulating materials. Other materials and thicknesses for STI region 138 are within the spirit and scope of this disclosure.

Semiconductor device 100 can further include a contact etch stop layer (CESL) 116 and an interlayer dielectric (ILD) layer 118 to provide an electrical insulation between adjacent fin structures 108. CESL 116 can be formed over gate spacer 114 and S/D regions 110 to protect gate spacer 104 and S/D region 110 during the formation of ILD layer 118. CESL 116 can be made of any suitable dielectric material, such as silicon nitride, silicon oxide, silicon oxynitride, silicon carbide, SiCN, SiOC, SiOCN, boron nitride, silicon boron nitride, and silicon boron carbon nitride. CESL 116 can have any suitable thickness, such as from about 1 nm to about 10 nm. Other materials and thicknesses for CESL 116 are within the scope and spirit of this disclosure.

ILD layer 118 can be formed over CESL 116. ILD layer 118 can be formed over fin structure 108 to provide an electrical insulation between adjacent fin structures 108. In some embodiments, ILD layer 118 can provide an electrical insulation between S/D region 110 and contact structure 120. By way of example and not limitation, ILD layer 118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material can be silicon oxide or silicon nitride. In some embodiments, ILD layer 118 can have a thickness from about 50 nm to about 200 nm. Other materials, thicknesses, and formation methods for ILD layer 118 are within the spirit and scope of this disclosure. In some embodiments, top surfaces of CESL 116, ILD layer 118, and gate spacer 114 can be substantially coplanar with each other.

Referring to FIGS. 1 and 2A, contact structure 120 can be sandwiched between FET 102 and interconnect structure 140 to electrically connect FET 102 to interconnect structure 140. Contact structure 120 can include an ILD layer 122 disposed over ILD layer 118 and over gate structure 112. In some embodiments, ILD layer 122 can include an etch stop layer (ESL) 122A and a layer of dielectric material 122B that can have different etching selectivity from ESL 122A. In some embodiments, the term "etching selectivity" can refer to the ratio of the etch rates of two materials under the same etching conditions. Each of ESL 122A and layer of dielectric material 122B can be made of any suitable insulating material, such as silicon nitride, silicon oxynitride, and silicon oxide. Each of ESL 122A and layer of dielectric material 122B can have any suitable thickness, such as from about 50 nm to about 200 nm. Other materials and thicknesses for ILD layer 122, such as for ESL 122A and layer of dielectric material 122B, are within the spirit and scope of this disclosure.

Contact structure 120 can further include a trench conductor layer 136 vertically (e.g., in the z-direction) extending through ILD layer 122 and over ILD layer 118 to contact S/D regions 110. In some embodiments, trench conductor layer 136 can represent FET 102's S/D contact structure that contacts FET 102's S/D regions 110. Trench conductor layer 136 can have a horizontal (e.g., in the x-direction) width $W_{136}$ less than or substantially equal to separation $S_{112}$. In some embodiments, width $W_{136}$ can represent the horizontal (e.g., in the x-direction) width of upper portion (e.g., proximate to ILD layer 122's top surface) and/or bottom portion (e.g., proximate to S/D region 110) of trench conductor layer 136. In some embodiments, width $W_{136}$ can be from about 13 nm to about 20 nm. If width $W_{136}$ is below the above-noted lower limit, trench conductor layer 136 may have an increased resistance that can result in degrading semiconductor device 100's performance. If width $W_{136}$ is beyond the above-noted upper limit, semiconductor device 100 may not meet an associated technology node's gate pitch requirement (e.g., gate pitch should be less than 75 nm for 7 nm, 5 nm, 3 nm nodes, etc.). Trench conductor layer 136 can have a suitable vertical (e.g., in the z-direction) height $H_{136}$, where a ratio of height $H_{136}$ to width $W_{136}$ can be from about 3 to about 6. If the ratio of height $H_{136}$ to width $W_{136}$ is less than the above-noted lower limit, a higher parasitic capacitance may be induced between interconnect structure 140 and S/D region 110, thus degrading FET 102's speed. If the ratio of height $H_{136}$ to width $W_{136}$ is greater than the above-noted upper limit, trench conductor layer 136 may incorporate void structures therein, thus degrading semiconductor device 100's reliability.

Trench conductor layer 136 can include a silicide layer 132 protruding into S/D region 110. Silicide layer 132 can provide a low resistance interface between layer of metallic material 130 (discussed below) and S/D region 110. Silicide layer 132 can be a metal silicide that can include titanium, cobalt, nickel, platinum, palladium, tungsten, molybdenum, tantalum, vanadium, chromium, silicon, or germanium. Silicide layer 132 can have any suitable thickness, such as from about 1 nm to about 20 nm. Other materials for silicide layer 132 are within the scope and spirit of this disclosure.

Trench conductor layer 136 can further include a layer of metallic material 130 formed over silicide layer 132. Layer of metallic material 130 can have a top surface 130T substantially coplanar with ILD layer 122. Layer of metallic material 130 can further have a bottom surface 130B (shown in FIG. 2A) over and in contact with silicide layer 132. Layer of metallic material 130 can be a liner-less (e.g., indentation-free) structure, such that layer of metallic material 130's top surface 130T (shown in FIG. 2A) and bottom surface 130B can connect layers of metallic material 130's two opposite side surfaces 130L and 130R (e.g., layer of metallic material 130 does not have a liner structure). With layer of metallic material 130 being a liner-less structure, a majority portion of trench conductor layer 136's width $W_{136}$ can contribute to the effective contact area of the contact structure (e.g., width $W_{136}$ is not consumed by the occupancy of liner structure), thus minimizing the resistance of trench conductor layer 136. In some embodiments, layer of metallic material 130 can be a liner-less structure, and layer of metallic material 130's top surface 130T and bottom surface 130B can each have a width substantially equal to trench conductor layer 136's width $W_{136}$ (e.g., the overall trench conductor layer 136 can be a liner-less structure). In some embodiments, layer of metallic material 130 can be a liner-less structure with slanted side surfaces 130L and 130R, such that layer of metallic material 130's top surface 130T can have a width (e.g., width $W_{136}$ proximate to top surface 130T) greater than another width (e.g., width $W_{136}$ proximate to surface 130B) of bottom layer of metallic material 130's surface 130B. In some embodiments, as shown in FIG. 2A, layer of metallic material 130's two opposite side surfaces 130L and 130R can be in contact with ILD layer 122 and CESL 116. In some embodiments, as shown in FIG. 2A, layer of metallic material 130's two opposite side surfaces 130L and 130R can be in contact with ILD layer 122 and a portion ILD layer 118 (e.g., the portion of ILD layer 118 is between layer of metallic material 130 and CESL 116; this embodiment is not shown in FIG. 2A).

In some embodiments, as shown in FIG. 3, semiconductor device 100 can further include an oxide liner 134 sandwiched between layer of metallic material 130 and ILD layer 122 or between layer of metallic material 130 and CESL 116. Oxide liner 134 can be formed during the process of forming silicide layer 132 (discussed in method 400). Accordingly, oxide liner 134 can include an identical metallic element, such as titanium, as silicide layer 132. Oxide liner 134 can have a thickness (e.g., a dimension in the x-direction), such as from about 0.5 nm to about 2 nm, that is less than trench conductor layer 136's width $W_{136}$. In some embodiments, a ratio of oxide liner 134's thickness to trench conductor layer 136's width $W_{136}$ can be from about 0.01 to about 0.1. If the ratio of oxide liner 134's thickness to trench conductor layer 136's width $W_{136}$ is less the above-noted lower limit, silicide layer 132 may not have sufficient thickness to reduce the contact resistance between S/D region 110 and trench conductor layer 136. If the ratio of oxide liner 134's thickness to trench conductor layer 136's width $W_{136}$ is greater the above-noted upper limit, trench conductor layer 136 may have increased resistance due to the loss of the effective contact area of trench conductor layer 136.

Referring back to FIGS. 1 and 2A, layer of metallic material 130 can be made of a metallic material that has a reduced diffusivity towards adjacent contact structure (e.g., towards trench conductor layer 128 (discussed below)) and towards adjacent dielectric layers (e.g., towards ILD layer 122 and CESL 116). Accordingly, layer of metallic material 130 can be a void-free structure after the process of forming of interconnect structure 140. Layer of metallic material 130 can be made of the metallic material that can further have an enhanced adhesion to the adjacent dielectric layers (e.g., enhanced adhesion to ILD layer 122 and/or CESL 116). Accordingly, layer of metallic material 130 and the overall trench conductor layer 136 can both be a barrierless and liner-less structure. Namely, both layer of metallic material 130 and trench conductor layer 136 do not include a barrier liner layer (e.g., a TaN layer or a TiN layer) as an adhesion promoter and/or diffusion blocker. Layer of metallic material 130 can be made of a Co-free metallic material and/or a Cu-free metallic material to meet the above-noted requirement of reduced diffusivity and enhanced adhesion. In some embodiments, layer of metallic material 130 can be made of a platinum-group metallic material, such as Ru, rhodium (Rh), and iridium (Ir). In some embodiments, layer of metallic material 130 can be made of Mo. In some embodiments, layer of metallic material 130 can be made of a single layer of metallic material, such as a single layer of platinum-group metallic material and a single layer of Mo. For example, layer of metallic material 130 can be a single layer of Ru, such that each portion (e.g., portion proximate to top surface 130T, side surfaces 130L and 130R, and bottom surface 130B) of layer of metallic material 130 is made of Ru. In some embodiments, layer of metallic material 130 can be made of multiple layers (not shown in FIG. 2A) of metallic material, where each of the multiple layer layers can be a liner-less (e.g., indentation-free) structure made of the platinum-group metallic material or Mo.

In some embodiments, as shown in FIG. 2C, layer of metallic material 130 can include multiple grain structures, such as grain structures 130G1 and 130G2. Grain structure 130G1 can be proximate to top surface 130T. In some embodiments, grain structure 130G1 can be proximate to layer of metallic material 130's metallic layers, such as proximate to trench conductor layer 128 (discussed below). Grain structure 130G2 can be proximate to layer of metallic material 130's dielectric layers, such as proximate to ILD layer 118 and ILD layer 122. Grain structure 130G1's average grain size (e.g., grain structure 130G1's average dimension in the x-direction, the y-direction, and/or the z-direction) can be greater than grain structure 130G2's average grain size (e.g., grain structure 130G2's average dimension in the x-direction, the y-direction, and/or the z-direction), because the adjacent dielectric layer (e.g., ILD layer 118 and ILD layer 122) can reduce layer of metallic material 130's grain growth rate during the process of forming layer of metallic material 130 (discussed at method 400). In some embodiments, grain structure 130G1's average size can be at least two times greater than grain structure 130G2's average size.

Contact structure 120 can further include a layer of dielectric material 124 disposed over trench conductor layer 136 and ILD layer 122. Layer of dielectric material 124 can include any suitable insulating material, such as silicon nitride, silicon oxynitride, silicon oxide, a metal-based oxide material (e.g., aluminum oxide), and a carbide material (e.g., silicon oxynitride carbide). Layer of dielectric material 124 can have any suitable thickness, such as from about 2 nm to about 30 nm. Other materials, thicknesses, and formation methods for layer of dielectric material 124 are within the spirit and scope of this disclosure.

Contact structure 120 can further include a layer of dielectric material 126 disposed over layer of dielectric material 124. Layer of dielectric material 126 and layer of dielectric material 124 can separate trench conductor layer 136 from interconnect structure 140. Layer of dielectric material 126 can be made of any suitable insulating material, such as silicon nitride, silicon oxynitride, silicon oxide, and a metal-based oxide material (e.g., aluminum oxide). In some embodiments, layer of dielectric material 126 and layer of dielectric material 124 can be made of different materials that have different etching selectivity from each other. Layer of dielectric material 126 can have any suitable thickness, such as from about 50 nm to about 200 nm. Other materials and thicknesses for layer of dielectric material 126 are within the spirit and scope of this disclosure.

Contact structure 120 can further include a trench conductor layer 128 vertically (e.g., in the z-direction) extending through layer of dielectric material 126 and layer of dielectric material 124 to contact the underlying trench conductor layer 136 and/or gate structure 112. Trench conductor layer 128 can further electrically connect interconnect structure 140 to the underlying trench conductor layer 136 and/or gate structure 112. Accordingly, trench conductor layer 128 together with trench conductor layer 136 can electrically bridge interconnect structure 140 and the S/D region 110 and/or gate structure 112. Trench conductor layer 128's top surface (e.g., the surface that is in contact with interconnect structure 140) can have any suitable horizontal dimension (e.g., width in the x-direction), such as from about 15 nm to about 50 nm, and any suitable vertical dimension (e.g., height in the z-direction), such as from about 100 nm to about 600 nm. In some embodiments, as shown in FIG. 2A, trench conductor layer 128's bottom surface that is in contact with layer of metallic material 130's top surface 130T can be less than or substantially equal to trench conductor layer 136's width $W_{136}$.

Trench conductor layer 128 can be made of any suitable conductive material, such as a platinum-group metallic material, Mo, W, Al, Cu, Co, Ta, a silicide material, and a conductive nitride material. In some embodiments, trench conductor layer 128 can be a liner-less (e.g., indentation-free) structure to provide a reduced resistance for trench conductor layer 128. Accordingly, trench conductor layer 128's top surface and bottom surface can connect trench conductor layer 128's two opposite side surfaces 128L and 128R. In some embodiments, trench conductor layer 128's two opposite side surfaces 128L and 128R can be in contact with dielectric layers 124 and 126. In some embodiments, trench conductor layer 128 can be made of the platinum-group metallic material or Mo, such that trench conductor layer 128 can be a barrierless and liner-less contact structure. In some embodiments, trench conductor layer 128 can be made of a single layer of metallic material. For example, trench conductor layer 128 can be a single layer of Ru, such that each portion (e.g., portion proximate to top, side, and bottom surfaces) of trench conductor layer 128 is made of Ru. In some embodiments, trench conductor layer 128 can be made of identical material with layer of metallic material 130 to eliminate the interfacial resistance between trench conductor layer 128 and trench conductor layer 136. For example, trench conductor layer 128's bottom portion that is in contact with layer of metallic material 130 can be made of an identical material, such as Ru, with layer of metallic material 130 to eliminate the interfacial resistance between trench conductor layer 128 and trench conductor layer 136. In some embodiments, trench conductor layer 128 can be made of multiple layers of metallic material, where each of the multiple layers of metallic material can be a liner-less structure made of the platinum-group metallic material or Mo.

Interconnect structure 140 can provide metal wire routings for the underlying FETs 102. Interconnect structure 140 can include a layer of insulating material 144, a layer of conductive material 146 embedded in layer of insulating material 144, a layer of insulating material 148 disposed over layer of conductive material 146, and a trench conductor layer 162 formed through layer of insulating material 148 and in contact with layer of conductive material 146. Layer of conductive material 146 can be a lateral (e.g., in the x-y plane) routing for the interconnect structure 140. On the contrary, each of trench conductor layers 128 and 136 can be a vertical (e.g., in the z-direction) wire routing for contact structure 120, and trench conductor layer 162 can be a vertical (e.g., in the z-direction) wire routing for the interconnect structure 140. Accordingly, in some embodiments, an aspect ratio (e.g., a ratio of height to width) of layer of conductive material 146 can be less than that of each of trench conductor layers 128, 136, and 162. In some embodiments, a ratio of layer of conductor material 146's aspect ratio to each of trench conductor layers 128, 136, and 162's aspect ratio can be less than about 1, less than about 0.8, less than about 0.6, less than about 0.4, less than about 0.2, or less than about 0.1. If conductor material 146's aspect ratio to each of trench conductor layers 128, 136, and 162's aspect ratio is beyond the above-noted upper limits, interconnect structure 140 may not meet an associated technology node's fin pitch requirement, thus failing an IC's product requirement. Layer of conductive material 146 can be disposed over one or more of trench conductor layer 128 and trench conductor layer 136 to electrically connect to the underlying gate structure 112 and S/D regions 110. Trench conductor layer 162 can electrically connect layer of conductive material 146 to another vertically (e.g., in the z-direction) above interconnect structure 140's layer of conductive material 146 (not shown in FIGS. 1-3). Layer of conductive material 146 and trench conductor layer 162 can be made of any suitable conductive material, such as W, Al, Cu, Co, Ti, Ta, Ru, Mo, a silicide material, and a conductive nitride material. Layer of insulating material 148 and layer of insulating material 144 can be made of a suitable dielectric material, such as silicon oxide, silicon nitride, silicon oxynitride, a low-k dielectric, and a high-k dielectric. Other materials for layer of conductive material 146, trench conductor layer 162, layer of insulating material 144, and layer of insulating material 148 are within the spirit and scope of this disclosure.

Figure 4:
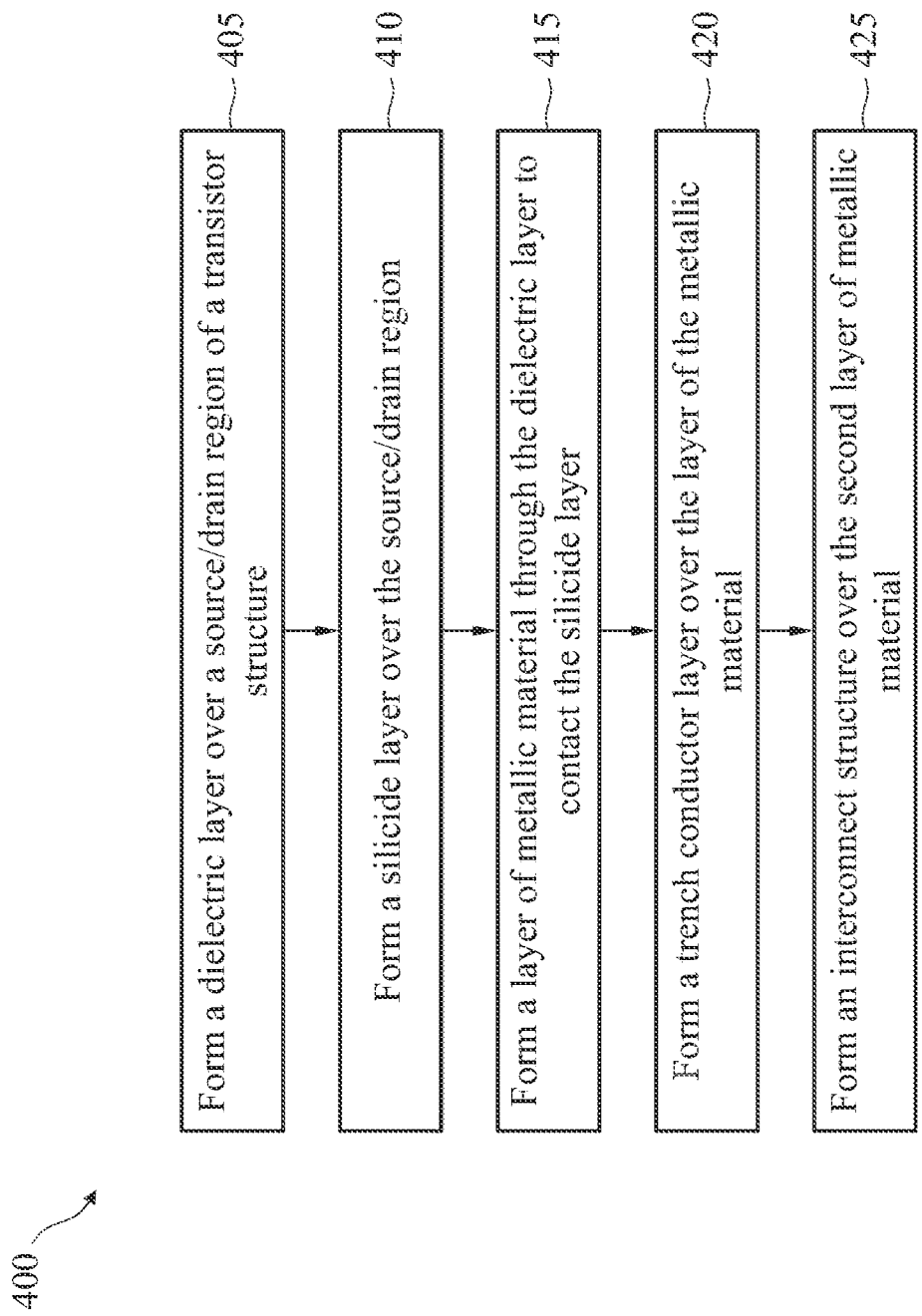
FIG. 4 is a flow diagram of a method for fabricating a semiconductor device, according to some embodiments.

FIG. 4 is a flow diagram of an example method 400 for fabricating semiconductor device 100, according to some embodiments. For illustrative purposes, the operations illustrated in FIG. 4 will be described with reference to FIGS. 5-16. FIGS. 5-16 are cross-sectional views along line A-A of FIG. 1 at various stages of the fabrication to form semiconductor device 100, according to some embodiments. Operations can be performed in a different order or not performed depending on specific applications. Method 400 may not produce a complete semiconductor device 100. Accordingly, it is understood that additional processes can be provided before, during, and after method 400, and that some other processes may only be briefly described herein. Further, the discussion of elements in FIGS. 1, 2A-2C, 3 and 5-16 with the same annotations applies to each other, unless mentioned otherwise.

Figure 5:
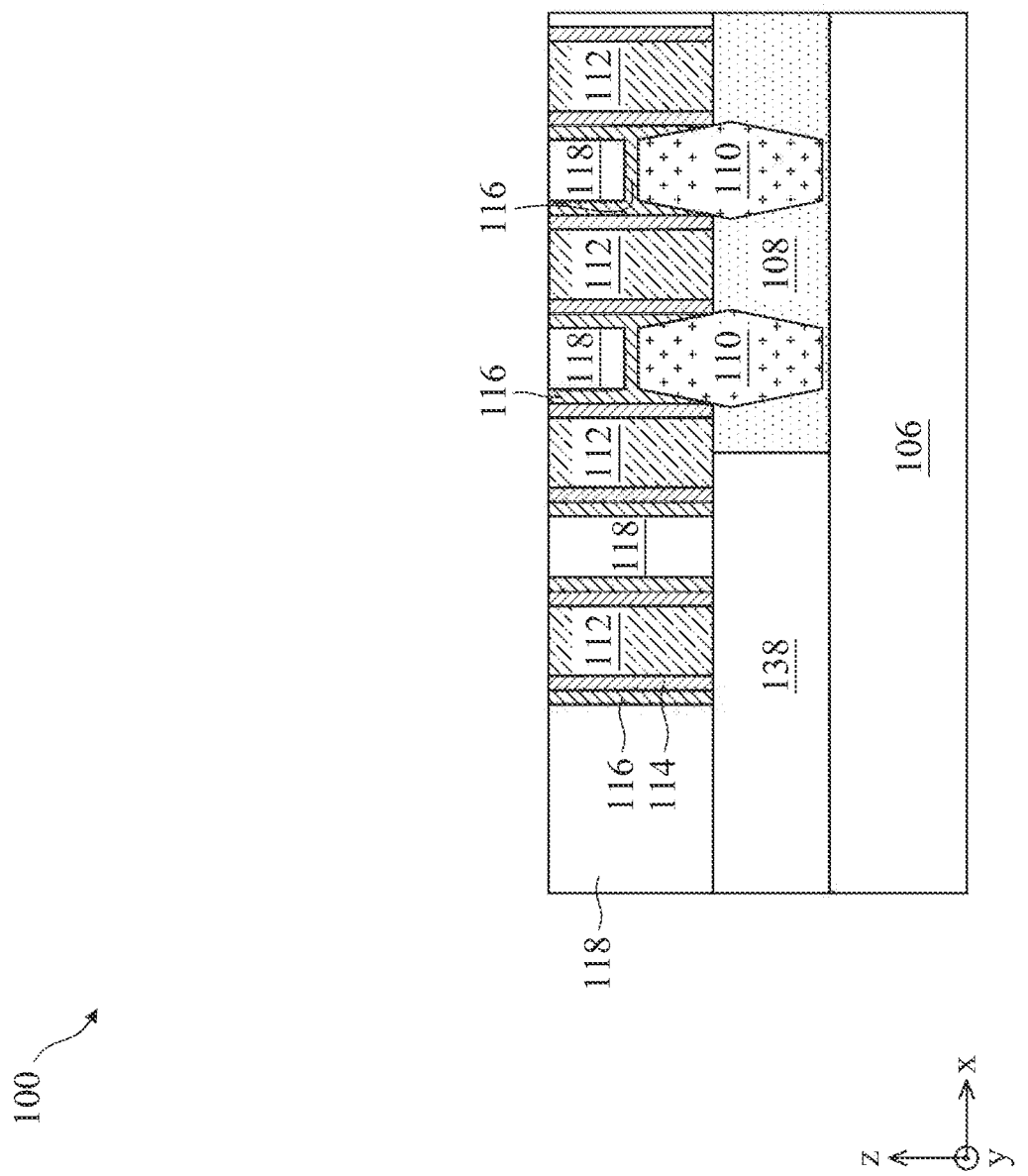
FIGS. 5-16 illustrate cross-sectional views of a semiconductor device at various stages of its fabrication process, according to some embodiments.
Figure 6:
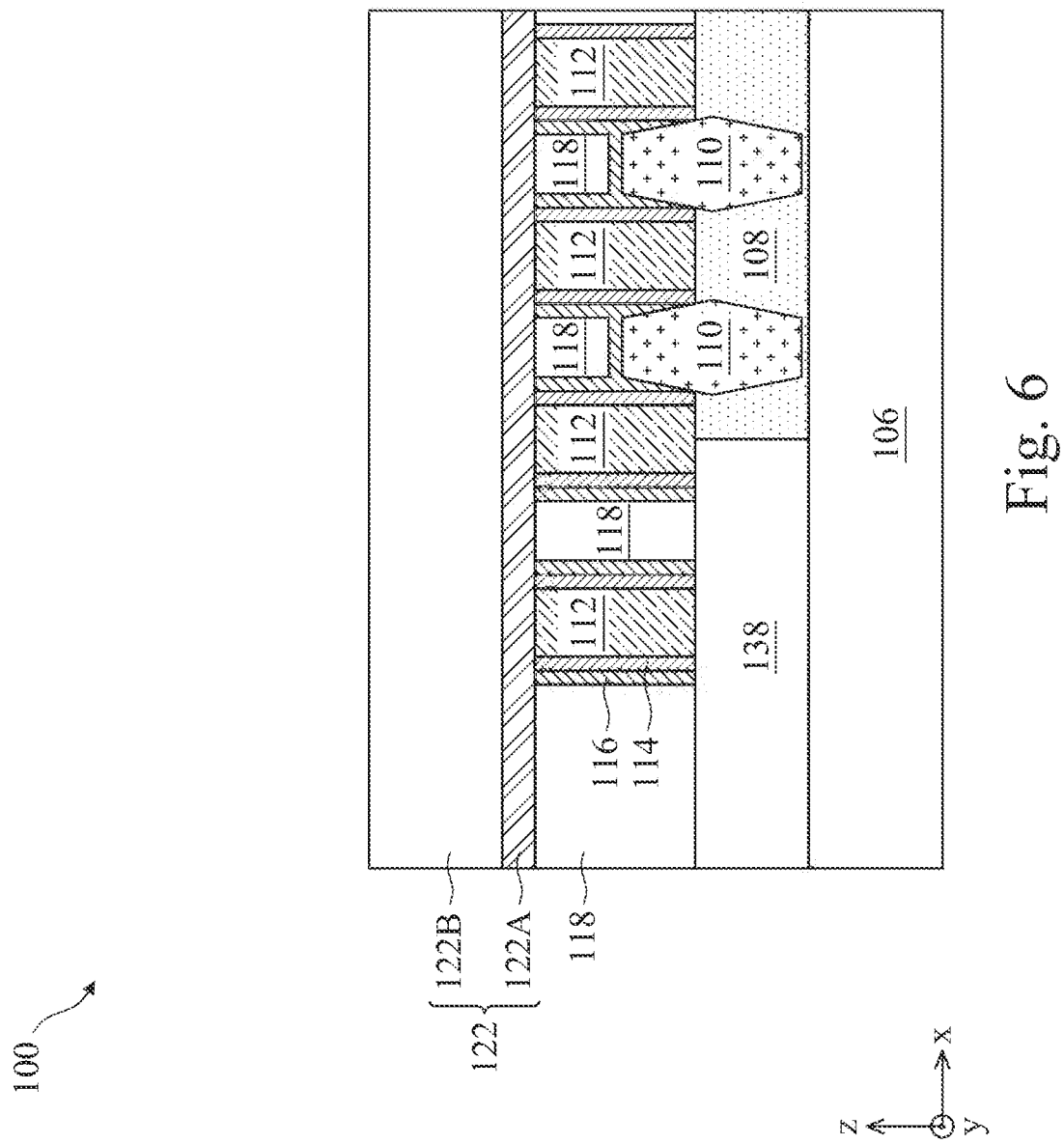

Referring to FIG. 4, in operation 405, a dielectric layer is formed over a source/drain (S/D) region of a transistor structure. For example, FIG. 6 shows ILD layer 122 formed over FETs 102's S/D region 110 as described with reference to FIGS. 5 and 6. The process of forming layer of dielectric material 122 can include (i) forming semiconductor device 100 of FIG. 5, and (ii) deposing (ESL) 122A and layer of dielectric material 122B over semiconductor device 100 of FIG. 5 using any suitable deposition process, such as a chemical vapor deposition (CVD) process, an atomic layer deposition (ALD) process, a physical vapor deposition (PVD) process, a plasma enhanced CVD (PECVD) process, and a spin-on process. In some embodiments, the process of forming semiconductor device 100 of FIG. 5 can include providing substrate 106, forming fin structure 108 on substrate 106, forming STI region 138 adjacent to fin structure 108, forming gate structure 112 traversing through fin structure 108, forming S/D regions 110, and forming CESL 116 and ILD layer 118 over a portion of fin structure 108 not covered by gate structure 112. In some embodiments, CESL 116 and ILD layer 118 can be substantially coplanar with gate structure 112. Other formation methods for semiconductor device 100 of FIG. 5 are within the spirit and scope of this disclosure.

Figure 7:
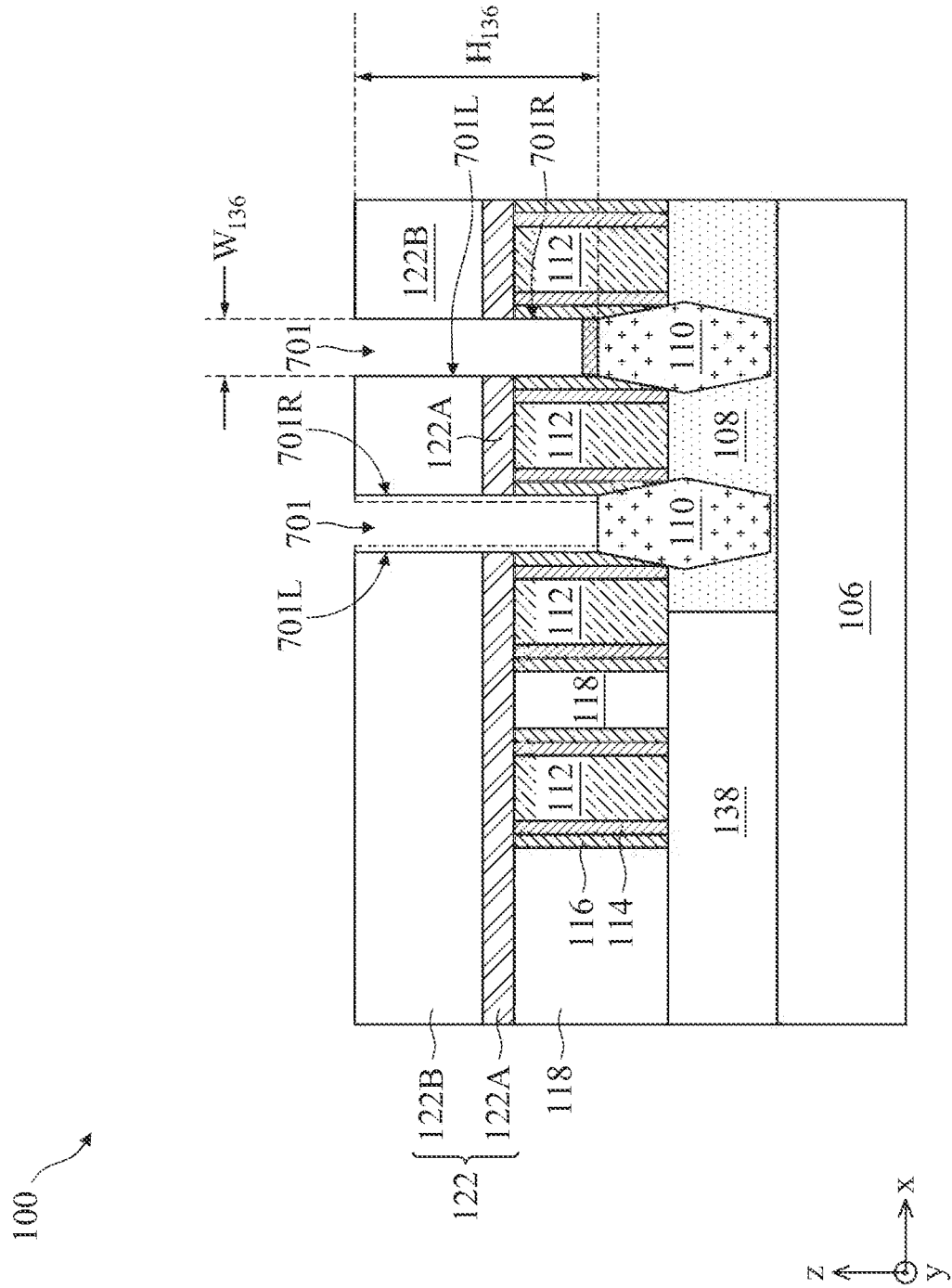

Referring to FIG. 4, in operation 410, a silicide layer is formed over the S/D region. For example, as shown in FIG. 9, silicide layer 132 can be formed over S/D region 110 with reference to FIGS. 7-9. Referring to FIG. 7, the process of forming silicide layer 132 can include forming a recess structure 701 through ILD layer 122 with a horizontal (e.g., in the x-direction) width $W_{136}$ and a vertical (e.g., in the z-direction) depth substantially equal to trench conductor layer 136's height $H_{136}$ using a lithography process and an etching process. Accordingly, recess structure 701 can expose underlying S/D region 110 and ILD layer 122's side surfaces. In some embodiments, recess structure 701 can further expose CESL 116's side surface, such that recess structure 701's two opposite side surfaces 701L and 701R can include CESL 116's side surfaces and ILD layer 122's side surfaces. In some embodiments, recess structure 701 can expose ILD layer 118's side surface (with CESL 116 being capped by ILD layer 118; not shown in FIG. 7), such that recess structure 701's two opposite side surfaces 701L and 701R can include ILD layer 118's side surfaces and ILD layer 122's side surfaces. In some embodiments, recess structure 701's two opposite side surfaces 701L and 701R can be substantially coplanar with layer of metallic material 130's side surfaces 130L and 130R after method 400. The etching process for forming recess structure 701 can include using a plasma dry etch associated with a suitable dry etchant, such as carbon tetrafluoride ($CF_4$), chlorine ($Cl_2$), and hydrogen bromide (HBr), or a wet etching process with a suitable wet etchant, such as hydrofluoric acid (HF), an ammonium peroxide mixture (APM), and tetramethylammonium hydroxide (TMAH).

Figure 8:
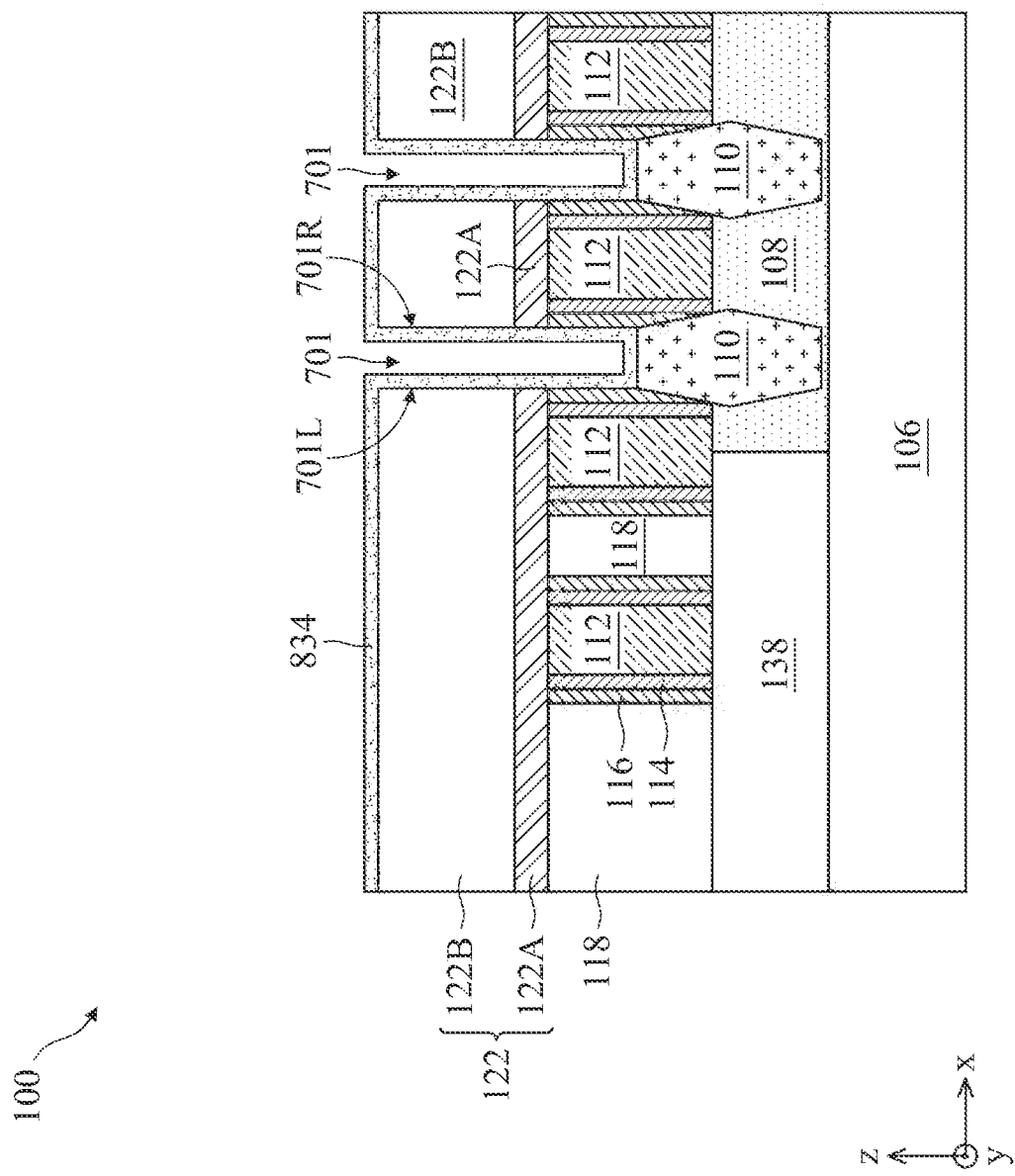
Figure 9:
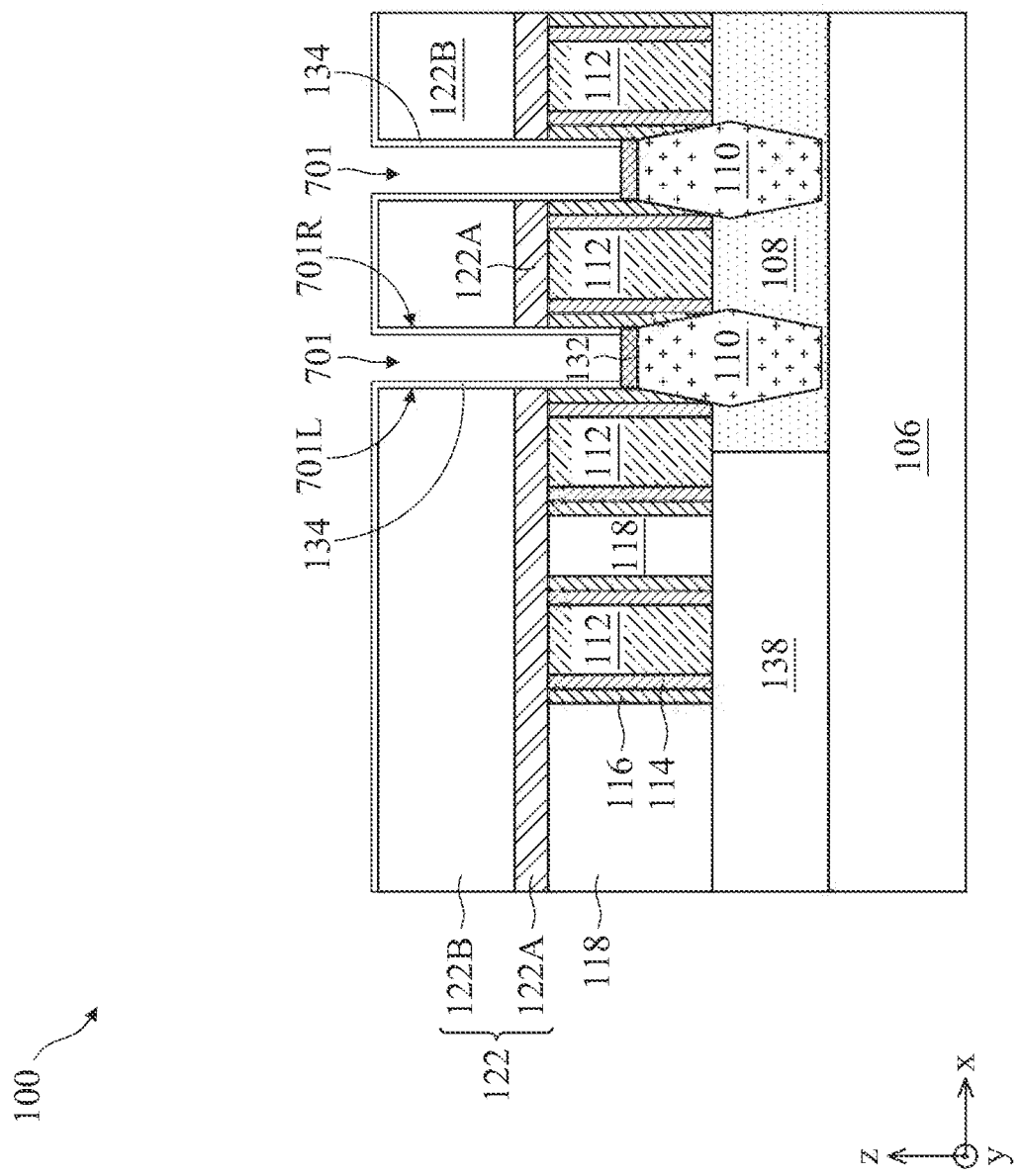

Referring to FIGS. 8 and 9, the process of forming silicide layer 132 can further include (i) depositing a layer of metallic material 834 (shown in FIG. 8), such as titanium, cobalt, nickel, tungsten, and any other suitable metallic material, over ILD layer 122 and in recess structures 701 to contact S/D region 110 and recess structure 701's side surfaces 701L and 701R using a deposition process, such as ALD and CVD; (ii) performing an annealing process on the structure of FIG. 8 to react a portion of the deposited layer of metallic material 834 with S/D region 110 to form silicide layer 132 (shown in FIG. 9); and (iii) selectively etching an un-reacted portion (not shown in FIG. 9) of the deposited layer of metallic material 834 over silicide layer 132 and/or oxide liner 134 using an etching process. In some embodiments, the annealing process of forming silicide layer 132 can further react the deposited layer of metallic material 834 with ILD layer 122, ILD layer 118 and/or CESL 116 (e.g., reacting the deposited layer of metallic material 834 with recess structure 701's side surfaces 701L and 701R) to form oxide layer 134 of FIG. 9. In some embodiments, the structure of FIG. 9 can result in semiconductor device 100 of FIG. 2A after the fabrication processes of operations 415-425 (discussed below).

Figure 10:
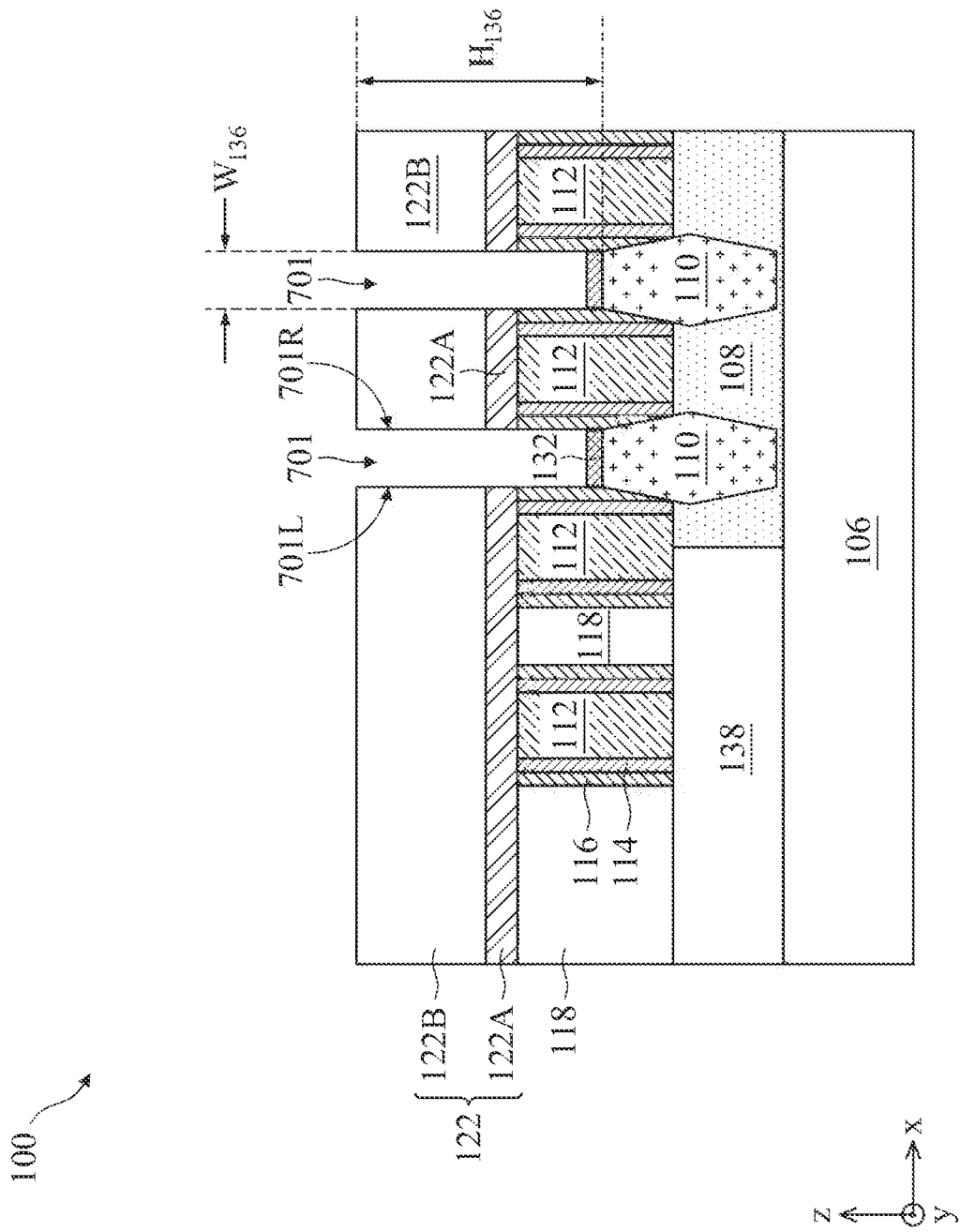

In some embodiments, referring to FIG. 10, the process of forming silicide layer 132 can further include selectively etch oxide layer 134 of FIG. 9 over silicide layer 132 to expose ILD layer 122 and recess structure 701's side surfaces 701L and 701R using a selective etching process. The selective etching process can be a plasma-free etching process that can provide a substantially uniform etching rate to etch oxide layer 134 from ILD layer 122's top surface and from recess structure 701's side surfaces 701L and 701R. In some embodiments, the plasma-free etching process can be a chemical vapor etching (CVE) process that applies a mixture of first and second dry etchants at a suitable temperature, such as about 250° C. The first dry etchant of the CVE process can include a chlorine-based gas, such as boron trichlorine ($BCl_3$), that can react with layer of metallic material 834 to form a byproduct (not shown in FIG. 10), and the second dry etchant of the CVE process can include a fluorine-based gas, such as HF gas, that can remove the aforementioned byproduct. In some embodiments, the plasma-free etching process can be a cyclic atomic layer etching (ALE) process, operating at a suitable temperature, such as from about 100° C. to about 250° C., that can include alternatively flowing first and second precursors (e.g., separately flowing first and second precursors at different time slots) at each cycle of the cyclic ALE process. The cyclic ALE process can further include a purging process (e.g., flowing an ambient gas, such as nitrogen, without flowing both first and second precursors) at each cycle of the cyclic ALE process. In some embodiments, the first precursor of each cycle of the cyclic ALE process can include a fluorine-based precursor, such as tungsten hexafluoride ($WF_6$), to change surface energy of layer of metallic material 834 (not shown in FIG. 10), and the second precursor of each cycle of the ALE process can include a chlorine-based precursor, such as boron trichlorine ($BCl_3$), to react with layer of metallic material 834 to form a byproduct. The purging process of each cycle of the ALE process can be performed between or after the steps of flowing first and second precursors to remove the aforementioned byproduct and the excess first and second precursors adhered to the structure of FIGS. 9 and 10. In some embodiments, the structure of FIG. 10 can result in semiconductor device 100 of FIG. 3 after the fabrication processes of operations 415-425 (discussed below).

Figure 11:
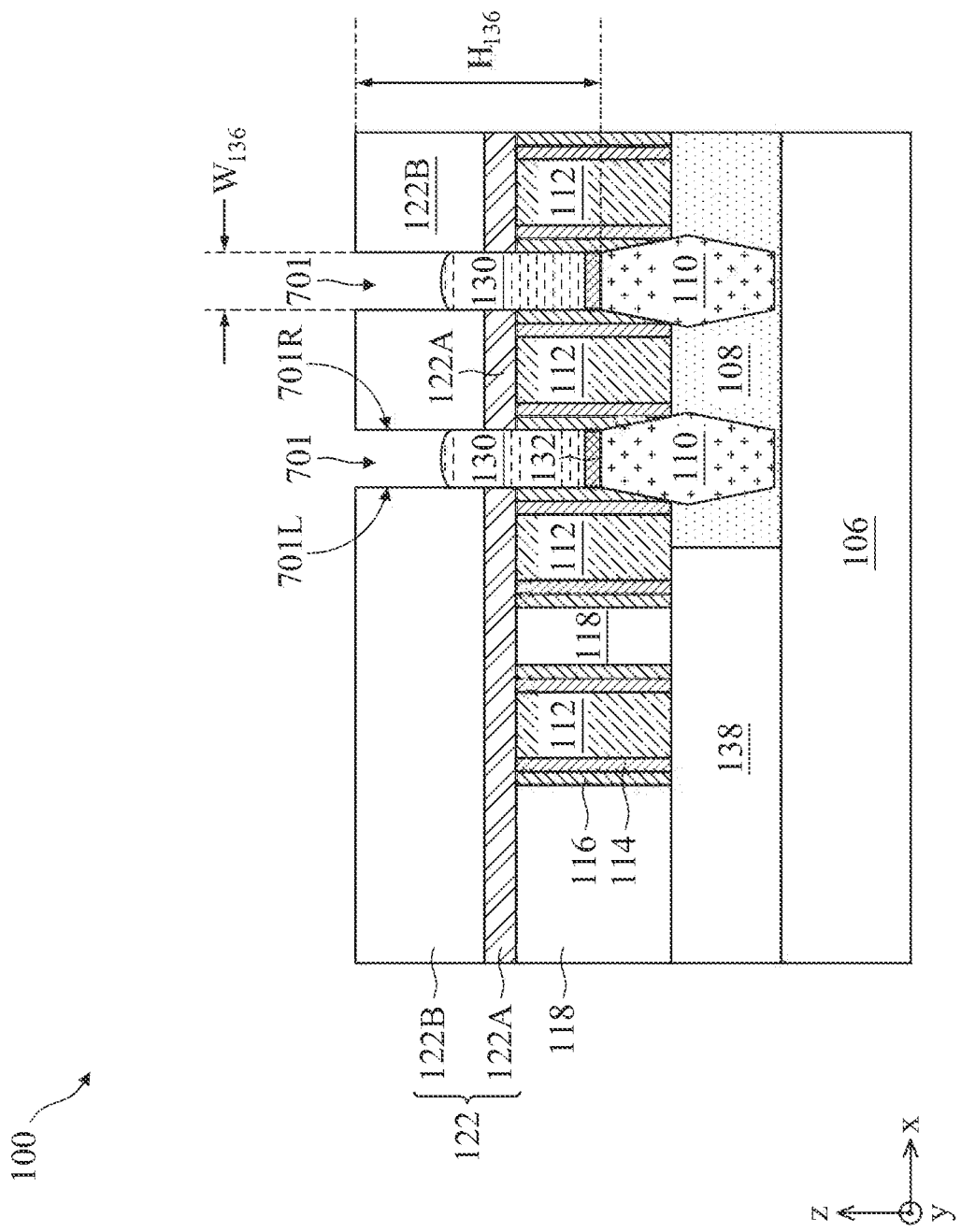

Referring to FIG. 4, in operation 415, a layer of metallic material is formed through the dielectric layer to contact the silicide layer. For example, as shown in FIG. 13, layer of metallic material 130 can be formed through ILD layer 122 to contact the underlying silicide layer 132 with reference to FIGS. 11-13. Referring to FIG. 11, the process for forming layer of metallic material 130 can include performing a non-conformal deposition process on the structure of FIG. 9 or FIG. 10 to deposit layer of metallic material 130 in recess structures 701 to contact the underlying silicide layer 132. The non-conformal deposition process for forming layer of metallic material 130 can have a higher deposition rate over silicide layer 132's top surface than over ILD layer 122's top surface. Accordingly, the non-conformal deposition process can mitigate gap-fill challenges due to small opening width $W_{136}$ of recess structure 701, thus avoiding forming void structure in layer of metallic material 130 after operation 415. Further, the non-conformal deposition process can prevent forming liner structure in recess structure 701, thus rendering layer of metallic material 130 being a liner-less structure after operation 415. In some embodiments, the non-conformal deposition process for forming layer of metallic material 130 can have a higher deposition rate over silicide layer 132's top surface than over recess structures 701's side surfaces 701L and 701R. In some embodiments, the non-conformal deposition process for forming layer of metallic material 130 can selectively deposit layer of metallic material 130 over silicide layer 132's top surface with ILD layer 122's top surfaces and/or recess structures 701's side surfaces 701L and 701R being exposed. In some embodiments, the non-conformal deposition process can include an ALD process or a CVD process with a metallic-contained precursor, such as triruthenium dodecacarbonyl ($Ru_3(CO)_{12}$; DCR), ruthenium oxide ($RuO_4$), Bis(ethylcyclopentadienyl) ruthenium(II) ($Ru(EtCp)_2$), ethyl-benzene ethyl-1,4-cyclohexadiene ruthenium (EBECHRu), bis(iso-propylcyclopentadienyl) ruthenium(II) ($C_{16}H_{22}Ru$), and carbonyl-diene precursor [$Ru(CO)_3C_6H_8$]. In some embodiments, as shown in FIG. 11, layer of metallic material 130 can have a curved top surface in recess structure 701 during the non-conformal deposition process.

Figure 12:
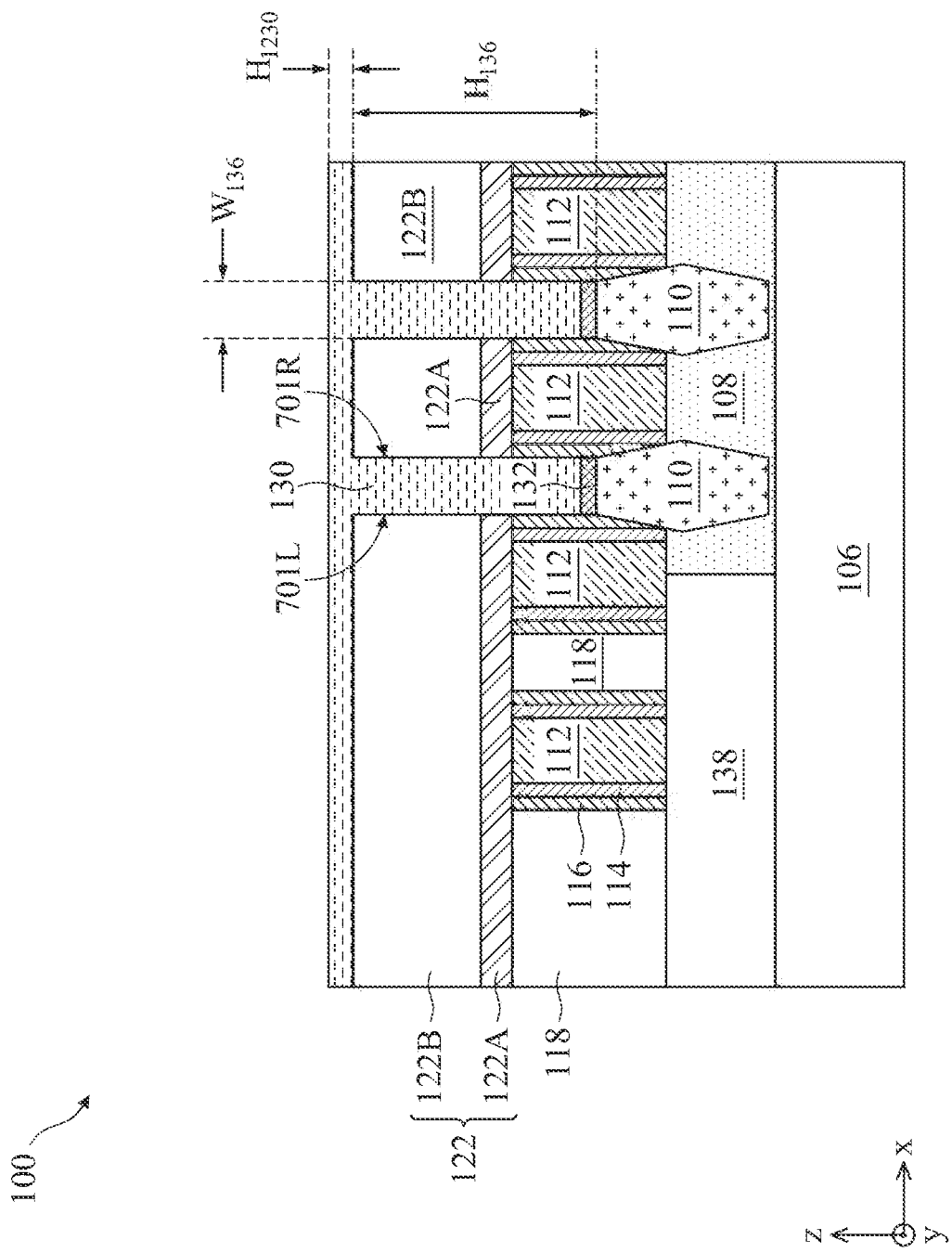
Figure 13:
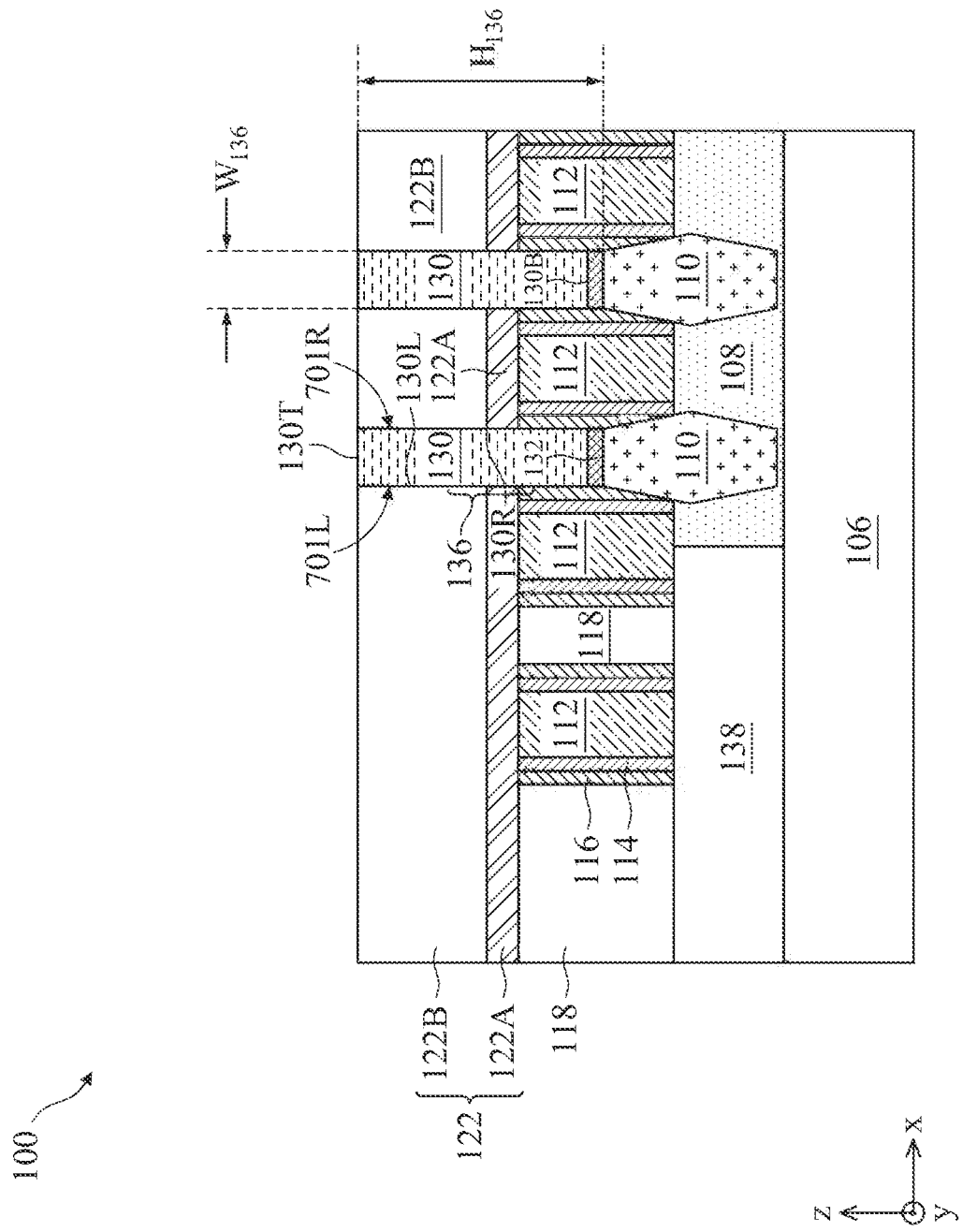

Referring to FIG. 12, the non-conformal deposition for forming layer of metallic material 130 can last until layer of metallic material 130 seals recess structures 701, such that (i) layer of metallic material 130 covers recess structures 701's side surfaces 701L and 701R, and (ii) portions of layer of metallic material 130 that is over silicide layer 132 protrudes is vertically (e.g., in the z-direction) higher than adjacent ILD layer 122's top surface. Since the non-conformal deposition process for forming layer of metallic material 130 can have a higher growth rate in recess structure 701 than over ILD layer 122's top surface, the resulting layer of metallic material 130 after operation 415 can have a vertical (e.g., in the z-direction) dimension $H_{1230}$ over ILD layer 122's top surface less than recess structure 701's depth $H_{136}$ (e.g., later becoming trench conductor layer 136's height $H_{136}$ after operation 415). In some embodiments, a ratio of vertical dimension $H_{1230}$ to recess structure 701's depth $H_{136}$ can be from about 0.01 to about 0.1. If the ratio of vertical dimension $H_{1230}$ to recess structure 701's depth $H_{136}$ is less than the above-noted lower limit, ILD layer 122 may be damaged during the subsequent polishing process in operation 415. If the ratio of vertical dimension $H_{1230}$ to recess structure 701's depth $H_{136}$ is greater than the above-noted upper limit, the non-conformal deposition process for forming layer of metallic material 130 may be susceptible to gap-fill challenges, thus forming void structures in layer of metallic material 130.

In some embodiments, the process for forming layer of metallic material 130 can further include performing an annealing process on the structure of FIG. 12 (e.g., after performing the non-conformal deposition process) to form or grow crystalline grains in layer of metallic material 130 to reduce the resistivity of layer of metallic material 130. The above-noted annealing process can be performed at a temperature range from about 300° C. to about 500° C. in a suitable ambient environment (e.g., nitrogen gas). If the temperature of the above-noted annealing process is less than the above-noted lower limit, layer of metallic material 130 may exhibit higher resistivity. If the temperature of the above-noted annealing process is greater than the above-noted upper limit, the underlying silicide layer 132 may be decomposed due to the thermal budget of silicide layer 132. In some embodiments, the above-noted annealing process can form grain structures 130G1 and 130G2 (shown in FIG. 2C) in layer of metallic material 130. Since the adjacent dielectric layer (e.g., ILD layer 118 and/or ILD layer 122) can reduce the migration rate of layer of metallic material 130's metallic elements (e.g., reducing Ru element's migration rate), the size of grain structure 130G2 (proximate to ILD layers 118/122) can be less than grain structure 130G1 (proximate to top surface of the structure of FIG. 12 and/or far from ILD layers 118/122).

Referring to FIG. 13, the process for forming layer of metallic material 130 can further include planarizing, such as by a chemical mechanical polishing (CMP) process, on the structure of FIG. 12 to coplanarize layer of metallic material 130 with ILD layer 122 to define layer of metallic material 130 and trench conductor layer 136. Accordingly, operation 415 can result in a liner-less layer of metallic material 130 with (i) top surface 130T substantially coplanar with ILD layer 122, (ii) bottom surface 130B in contact with silicide layer 132, and (iii) side surfaces 130L and 130R being substantially coplanar with recess structures 701's side surfaces 701L and 701R.

In some embodiments, the process for forming layer of metallic material 130 can further include performing an annealing process on the structure of FIG. 13 (e.g., after performing the planarizing process) to form or grow crystalline grains in layer of metallic material 130 to reduce the resistivity of layer of metallic material 130. The above-noted annealing process can be performed at a temperature range from about 300° C. to about 500° C. in a suitable ambient environment (e.g., nitrogen gas). If the temperature of the above-noted annealing process is less than the above-noted lower limit, layer of metallic material 130 may exhibit higher resistivity. If the temperature of the above-noted annealing process is greater than the above-noted upper limit, the underlying silicide layer 132 may be decomposed due to the thermal budget of silicide layer 132.

Figure 14:
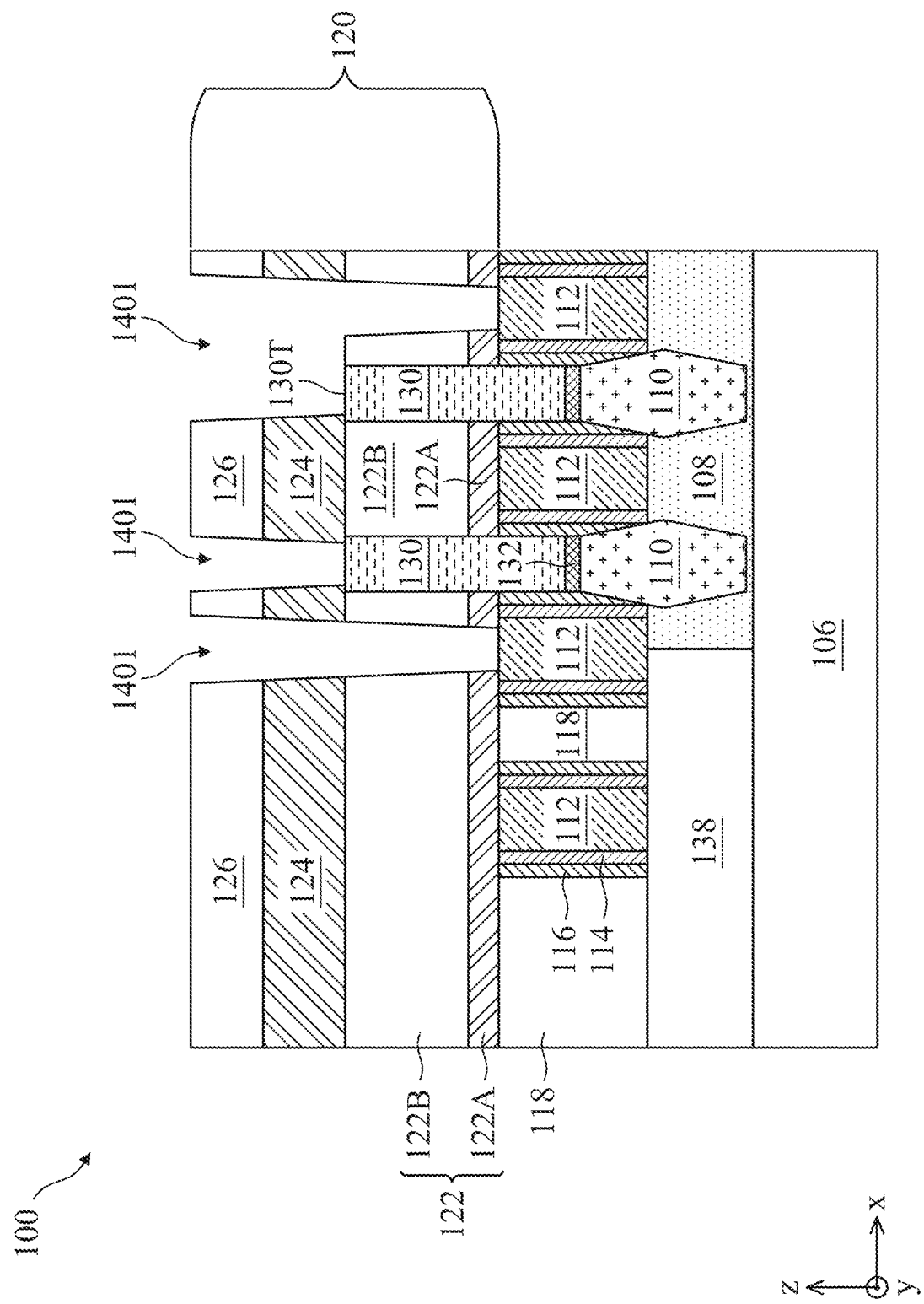
Figure 15:
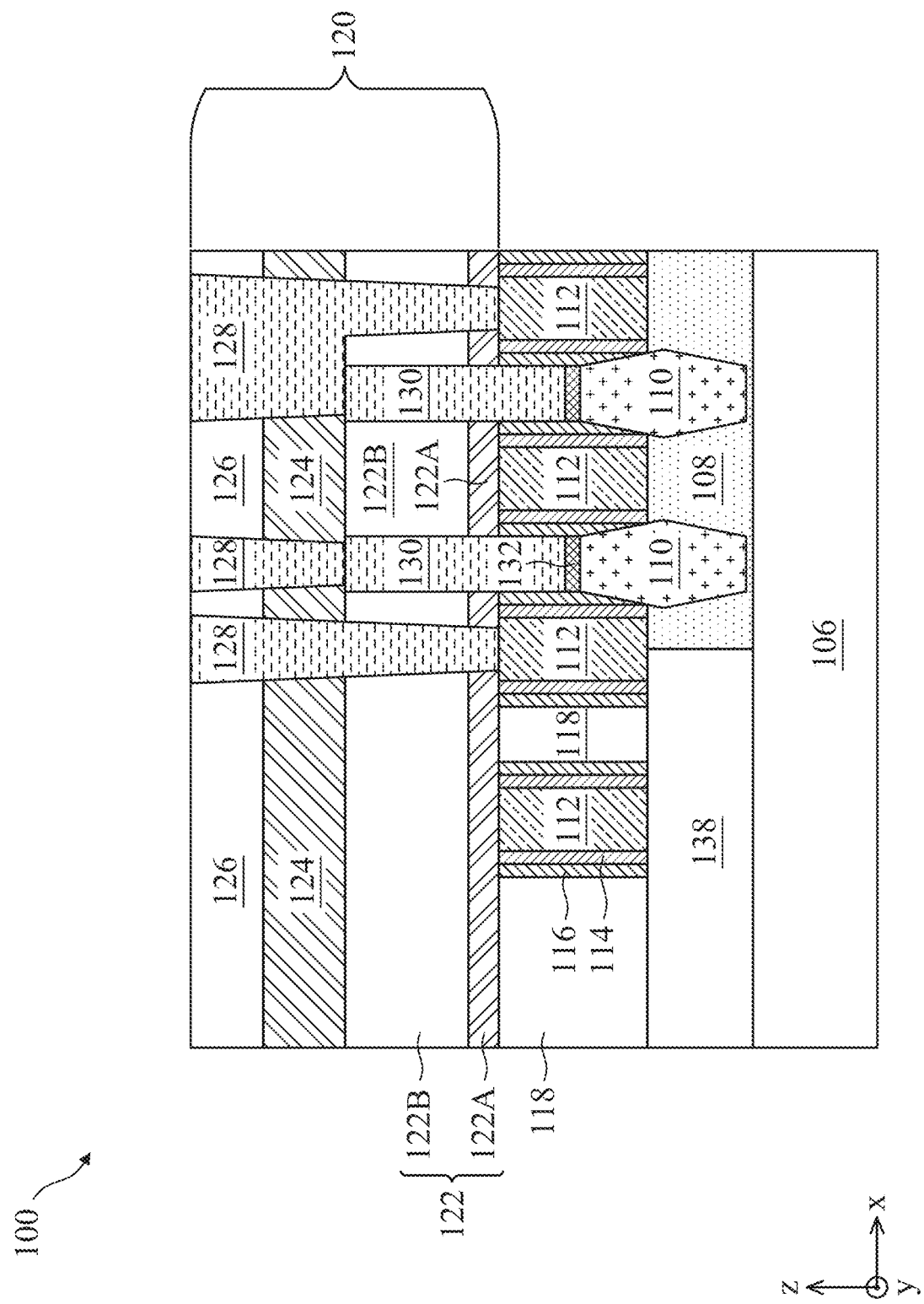

Referring to FIG. 4, in operation 420, a trench conductor is formed over the layer of metallic material. For example, as shown in FIG. 15, trench conductor layer 128 can be formed over layer of metallic material 130 with reference to FIGS. 14 and 15. As shown in FIG. 14, the process for forming trench conductor layer 128 can include deposing layer of dielectric material 124 and layer of dielectric material 126 over the structure of FIG. 13 using any suitable deposition process, such as a CVD process, an ALD process, a PVD process, a PECVD process, and a spin-on process.

The process for forming trench conductor layer 128 can further include forming a recess structure 1401 through layers of dielectric material 126 and 128 to expose the underlying trench conductor layer 136, such as exposing the underlying layer of metallic material 130 using a lithography process and an etching process. In some embodiments, recess structure 1401 can further expose the underlying gate structure 112.

Referring to FIG. 15, the process for forming trench conductor layer 128 can further include filling a conductive material in recess structure 1401 to define trench conductor layer 128 substantially coplanar with layer of dielectric material 126 and in contact trench conductor layer 136 and/or gate structure 112 using a deposition process and a CMP process. The filled conductive material can be identical to the material of trench conductor layer 128. In some embodiments, the filled conductive material can be a single layer of platinum-group metallic material or a single layer of Mo. In some embodiments, the filled conductive material can be multiple layers of platinum-group metallic material or Mo. In some embodiments, the filled conductive material can be identical metallic materials (e.g., Ru) of layer of metallic material 130. The deposition process for forming trench conductor layer 128 can include a CVD process, an ALD process, or a PVD process. In some embodiments, the deposition process for forming trench conductor layer 128 can be a non-conformal deposition process that has a higher deposition rate over layer of metallic material 130's top surface 130T than over layer of dielectric material 126's top surface.

Figure 16:
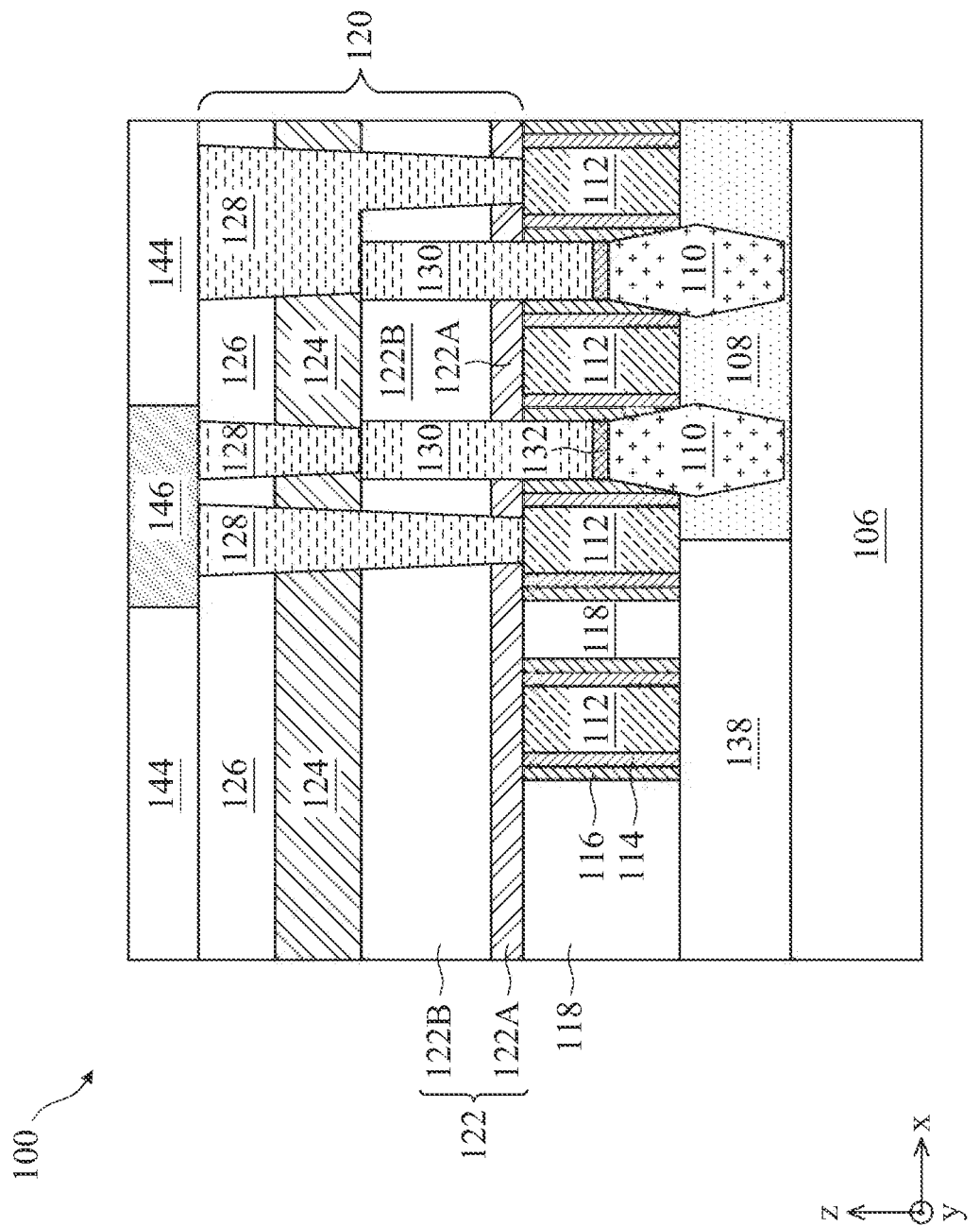

Referring to FIG. 4, in operation 425, an interconnect structure is formed over the trench conductor layer. For example, as shown in FIGS. 1-3, interconnect structure 140 can be formed over trench conductor layer 128 as described in reference to FIGS. 16 and 1-3. Referring to FIG. 16, a process of forming interconnect structure 140 can include (i) forming a patterned layer of insulating material 144 over the structure of FIG. 15 to expose trench conductor layer 128 using a deposition process and an etching process, (ii) blanket depositing a conductive material over the patterned layer of insulating material 144 using a deposition process, and (iii) polishing the deposited conductive material using a CMP process to form layer of conductive material 146 substantially coplanar with layer of insulating material 144. The process of forming interconnect structure 140 can further include (i) blanket depositing layer of insulating material 148 (shown in FIGS. 2A and 3) over the structure of FIG. 16 using a deposition process, such as a CVD process, a PECVD process, a PVD process, and an ALD process, (ii) forming one or more recess structures (not shown in FIG. 16) through layer of insulating material 148 using a lithography process and an etching process, and (iii) filling the one or more recess structures with a conductive material to form trench conductor layer 162 (shown in FIGS. 2A and 3) using a deposition process (e.g., CVD, ALD, PVD, or e-beam evaporation) and a polishing process (e.g., a CMP process). Since layer of metallic material 130 can be made of platinum-group metallic material or Mo, the deposition processes in operation 425 do not cause out-diffusion of metallic material from layer of metallic material 130, thus rendering trench conductor layer 136 being void-free after operation 425.

The present disclosure provides a contact structure and a method for forming the same. The contact structure can be a S/D contact structure formed over a transistor structure's S/D region. The contact structure can be made of one or more layers of metallic materials that have a reduced diffusivity. Accordingly, the contact structure can be free from voids during or after the process of forming the interconnect structure. Further, the contact structure can be a barrierless structure (e.g., without liner structure), because the metallic material of the contact structure can have a sufficient adhesion to the contact structure's adjacent dielectric sidewalls. The metallic materials for the contact structure can include a platinum-group metallic material (e.g., Ru). Therefore, the contact structure of the present disclosure can have a reduced resistance compared to another contact structure made of cobalt or copper. Accordingly, a benefit of the present disclosure, among others, is to provide the contact structure with enhanced structural integrity (e.g., without voids) and reduced resistance, thus enhancing IC reliability and performance.

In some embodiments, a semiconductor structure can include a substrate, a gate structure over the substrate, a layer of dielectric material over the gate structure, a source/drain (S/D) contact layer formed through and adjacent to the gate structure, and a trench conductor layer over and in contact with the S/D contact layer. The S/D contact layer can include a layer of platinum-group metallic material and a silicide layer formed between the substrate and the layer of platinum-group metallic material. A top width of a top portion of the layer of platinum-group metallic material can be greater than or substantially equal to a bottom width of a bottom portion of the layer of platinum-group metallic material.

In some embodiments, a method for forming a semiconductor structure can include forming a source/drain (S/D) region over a substrate, forming a layer of dielectric material over the S/D region, forming a recess structure in the layer of dielectric material to expose the S/D region, depositing a first layer of metallic material in the recess structure at a first deposition rate and over the layer of dielectric material at a second deposition rate less than the first deposition rate, and forming a second layer of metallic material over and in contact with the first layer of metallic material.

In some embodiments, a method for forming a semiconductor structure can include forming first and second gate structures over a substrate, forming a layer of dielectric material over the first and second gate structures, forming a recess structure in the layer of dielectric material and between the first and second gate structures, forming a first layer of metallic material to fill and seal the recess structure, forming a second layer of metallic material over and in contact with the first layer of metallic material, and forming an interconnect structure over and in contact with the second layer of metallic material. The first and second layers of metallic material can include an identical platinum-group metallic material.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a source/drain (S/D) region over a substrate;
forming a layer of dielectric material over the S/D region;
forming a recess structure in the layer of dielectric material to expose the S/D region;
depositing a first layer of metallic material in the recess structure at a first deposition rate and on a sidewall of the layer of dielectric material at a second deposition rate less than the first deposition rate, wherein the first layer of metallic material is in contact with the sidewall of the layer of dielectric material; and
forming a second layer of metallic material over and in contact with the first layer of metallic material.

2. The method of claim 1, wherein forming the recess structure comprises forming the recess structure with a width from about 5 nm to about 20 nm.

3. The method of claim 1, wherein depositing the first layer of metallic material comprises depositing a platinum-group metallic material in the recess structure to seal the recess structure.

4. The method of claim 1, wherein depositing the first layer of metallic material comprises annealing the substrate with the deposited first layer of metallic material prior to forming the second layer of metallic material.

5. The method of claim 1, further comprising forming a silicide layer between the first layer of metallic material and the S/D region, wherein forming the silicide layer comprises forming a metal oxide layer over side surfaces of the recess structure.

6. The method of claim 5, further comprising performing an atomic layer etching process to selectively etch the metal oxide layer over the silicide layer.

7. The method of claim 1, further comprising forming a gate structure adjacent to the S/D region, wherein forming the second layer of metallic material comprises forming the second layer of metallic material over and in contact with the gate structure.

8. The method of claim 1, further comprising forming an additional layer of dielectric material on the layer of dielectric material and the first layer of metallic material prior to forming the second layer of metallic material, wherein the second layer of metallic material extends through the layer of dielectric material and the additional layer of dielectric material.

9. The method of claim 1, further comprising planarizing top surfaces of the layer of dielectric material and the first layer of metallic material prior to forming the second layer of metallic material.

10. The method of claim 5, wherein forming the silicide layer comprises depositing a third layer of metallic material in the recess structure and on the layer of dielectric material, wherein the third layer of metallic material is in contact with the S/D region.

11. The method of claim 1, wherein forming the second layer of metallic material comprises depositing a platinum-group metallic material on the first layer of metallic material.

12. A method, comprising:
forming a transistor on a substrate, wherein the transistor comprises a source/drain (S/D) region and a gate structure;
forming a layer of dielectric material on the transistor;
forming a recess structure in the layer of dielectric material to expose the S/D region;
forming a silicide layer on the S/D region in the recess structure, wherein forming the silicide layer comprises forming a metal oxide layer over side surfaces of the recess structure;
depositing a first layer of metallic material on the silicide layer at a first deposition rate and on the side surfaces of the recess structure at a second deposition rate, wherein the first deposition rate is greater than the second deposition rate; and
forming a second layer of metallic material on the first layer of metallic material.

13. The method of claim 12, wherein depositing the first layer of metallic material comprises filling the recess structure with a platinum-group metallic material.

14. The method of claim 12, further comprising annealing, prior to forming the second layer of metallic material, the deposited first layer of metallic material at a temperature ranging from about 300° C. to about 500° C.

15. The method of claim 12, further comprising:
depositing a third layer of metallic material in the recess structure prior to depositing the first layer of metallic material;
annealing the third layer of metallic material to form a silicide layer on the S/D region and a metal oxide layer on the first layer of dielectric material; and
removing the metal oxide layer on the layer of dielectric material with an atomic layer etching process.

16. The method of claim 12, wherein forming the second layer of metallic material comprises forming the second layer of metallic material extending through the layer of dielectric material and in contact with the gate structure.

17. A method, comprising:
forming a source/drain (S/D) region between first and second gate structures on a substrate;
forming a layer of dielectric material on the S/D region and the first and second gate structures;
forming a recess structure extending through the layer of dielectric material to expose the S/D region;
depositing a first layer of metallic material on the S/D region at a first deposition rate and on a sidewall of the layer of dielectric material at a second deposition rate, wherein the first deposition rate is greater than the second deposition rate; and
forming a second layer of metallic material on the first layer of metallic material.

18. The method of claim 17, wherein depositing the first layer of metallic material comprises filling the recess structure with a platinum-group metallic material.

19. The method of claim 17, further comprising annealing, prior to forming the second layer of metallic material, the deposited first layer of metallic material at a temperature ranging from about 300° C. to about 500° C.

20. The method of claim 17, further comprising:
depositing a third layer of metallic material in the recess structure prior to depositing the first layer of metallic material;
annealing the third layer of metallic material to form a silicide layer on the S/D region and a metal oxide layer on the layer of dielectric material; and
removing the metal oxide layer on the layer of dielectric material with an atomic layer etching process.

* * * * *